(12) United States Patent
Brink et al.

(10) Patent No.: US 9,053,982 B2
(45) Date of Patent: Jun. 9, 2015

(54) LOCAL TAILORING OF FINGERS IN MULTI-FINGER FIN FIELD EFFECT TRANSISTORS

(71) Applicant: International Business Machines Corporation, Armonk, NY (US)

(72) Inventors: Markus Brink, White Plains, NY (US); Josephine B. Chang, Mahopac, NY (US); Michael A. Guillorn, Yorktown Heights, NY (US); HsinYu Tsai, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 21 days.

(21) Appl. No.: 13/679,284

(22) Filed: Nov. 16, 2012

(65) Prior Publication Data

US 2014/0138771 A1    May 22, 2014

(51) Int. Cl.
*H01L 21/8234* (2006.01)
*H01L 27/12* (2006.01)

(52) U.S. Cl.
CPC .... *H01L 27/1211* (2013.01); *H01L 21/823431* (2013.01)

(58) Field of Classification Search
CPC ............... H01L 27/1203; H01L 21/84; H01L 29/66772; H01L 27/12; H01L 27/1214
USPC ........................................................ 257/347
See application file for complete search history.

(56) References Cited

U.S. PATENT DOCUMENTS

| | | | |
|---|---|---|---|
| 8,236,634 B1 * | 8/2012 | Kanike et al. .................. | 438/155 |
| 2007/0181947 A1 | 8/2007 | Ching Ho Chan et al. | |
| 2008/0001176 A1 * | 1/2008 | Gopalakrishnan et al. ... | 257/211 |
| 2009/0014798 A1 * | 1/2009 | Zhu et al. ...................... | 257/351 |
| 2011/0111592 A1 | 5/2011 | Cheng et al. | |
| 2011/0133162 A1 * | 6/2011 | Bangsaruntip et al. ......... | 257/24 |
| 2013/0161756 A1 | 6/2013 | Glass et al. | |

OTHER PUBLICATIONS

Fritze, M. et al., "Gratings of Regular Arrays and Trim Exposures for Ultralarge Scale Integrated Circuit Phase-Shift Lithography" J. Vac. Sci. Technol. B. (Nov./Dec. 2001) pp. 2366-2370, vol. 19, No. 6.
Office Action dated Sep. 12, 2013 received in a related U.S. Patent Application, namely U.S. Appl. No. 13/741,978.
U.S. Office Action dated Feb. 28, 2014 issued in related U.S. Appl. No. 13/741,978.

* cited by examiner

*Primary Examiner* — Lex Malsawma
*Assistant Examiner* — Long Le
(74) *Attorney, Agent, or Firm* — Scully, Scott, Murphy & Presser, P.C.; Louis J. Percello, Esq.

(57) ABSTRACT

A cluster of semiconductor fins is formed on an insulator layer. A masking material layer is formed over the array of semiconductor fins such that spaces between adjacent semiconductor fins are filled with the masking material layer. A photoresist layer is applied over the masking material layer, and is lithographically patterned. The masking material layer is etched to physically expose a sidewall surface of a portion of an outermost semiconductor fin in regions not covered by the photoresist layer. A recessed region is formed in the insulator layer such that an edge of the recessed region is formed within an area from which a portion of the semiconductor fin is removed. The photoresist layer and the masking material layer are removed. Within the cluster, a region is provided that has a lesser number of semiconductor fins than another region in which semiconductor fins are not etched.

25 Claims, 18 Drawing Sheets

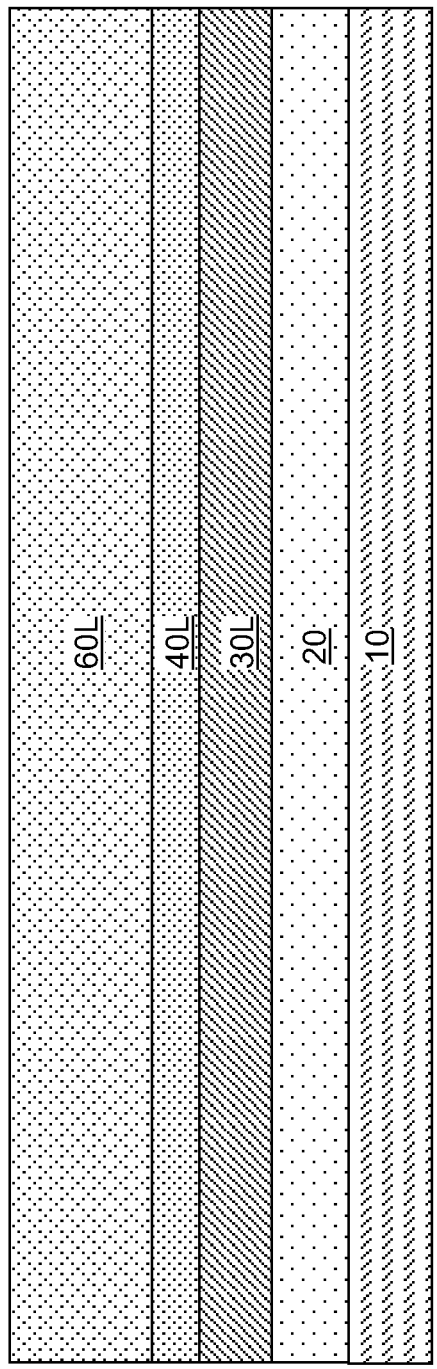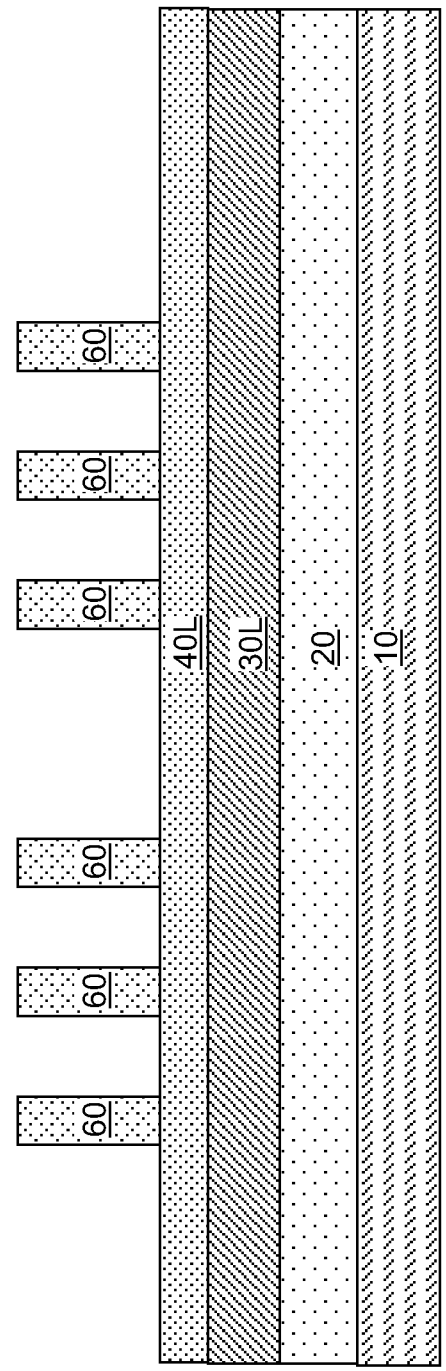

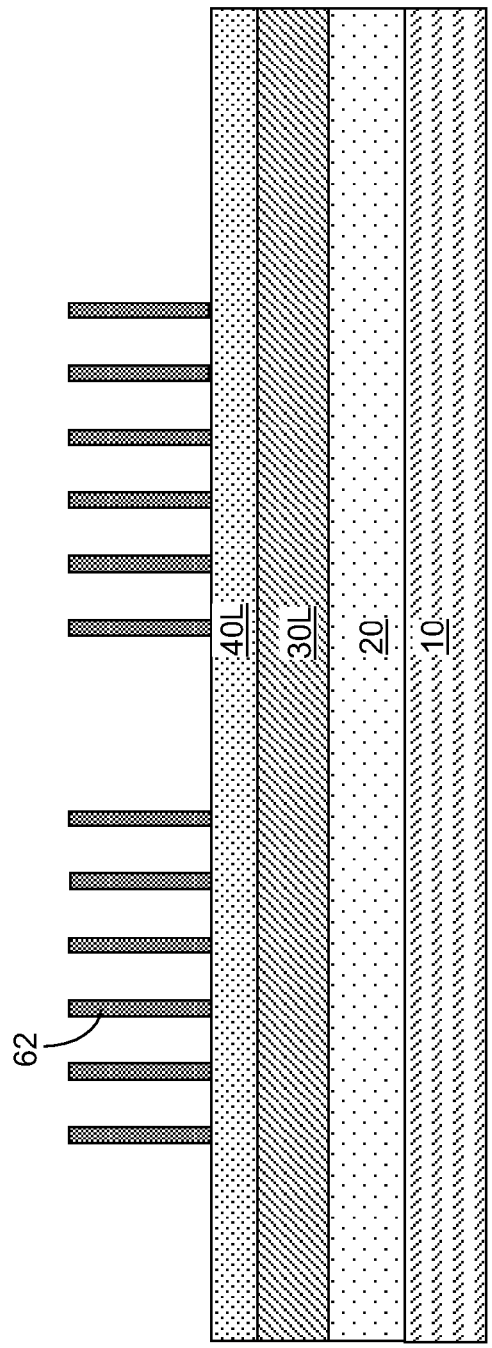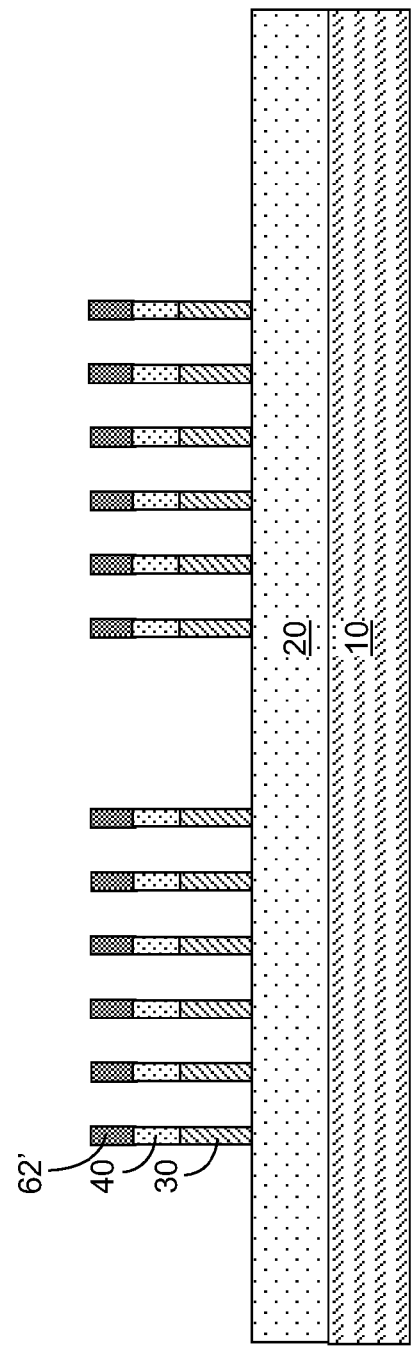

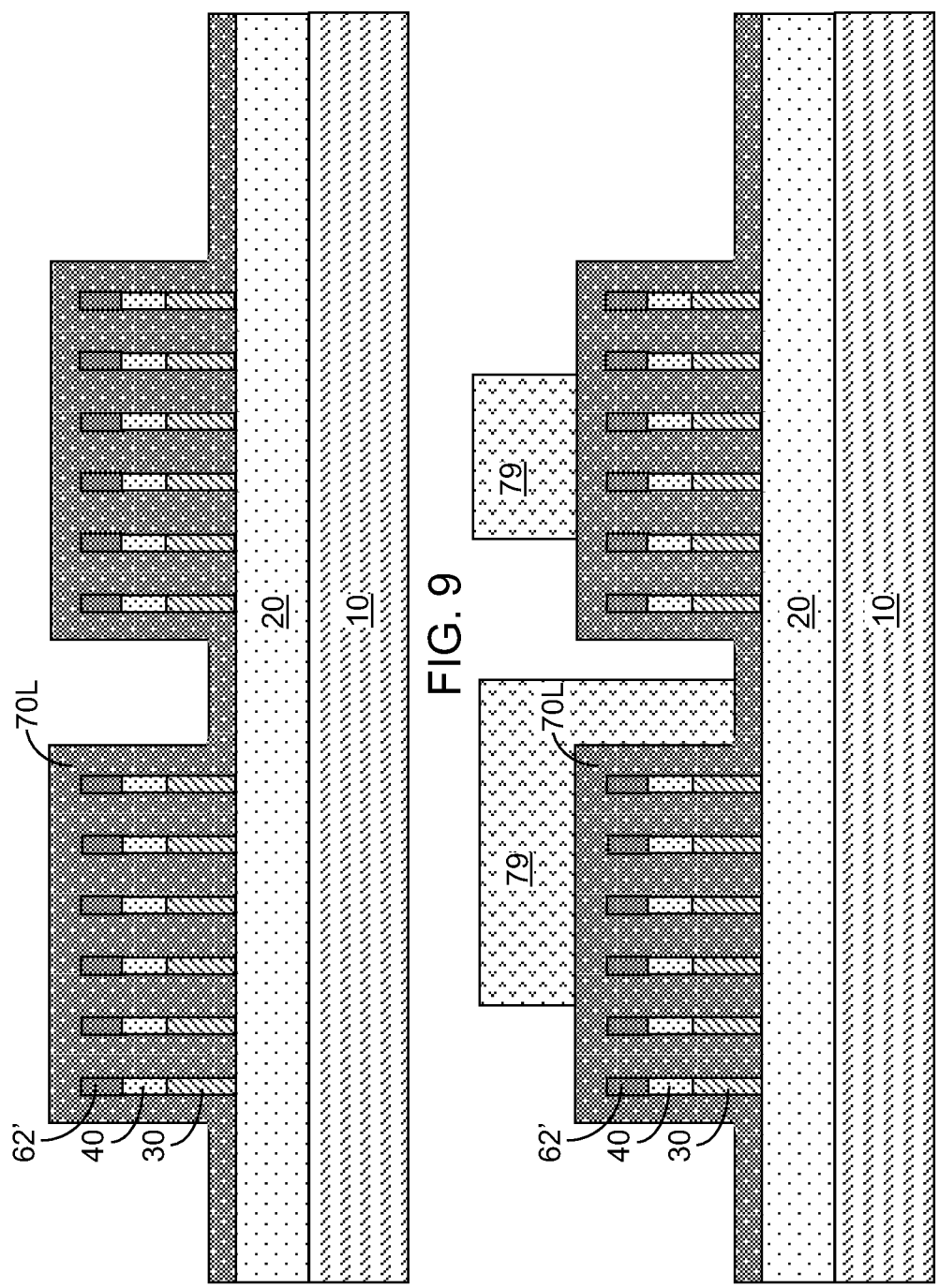

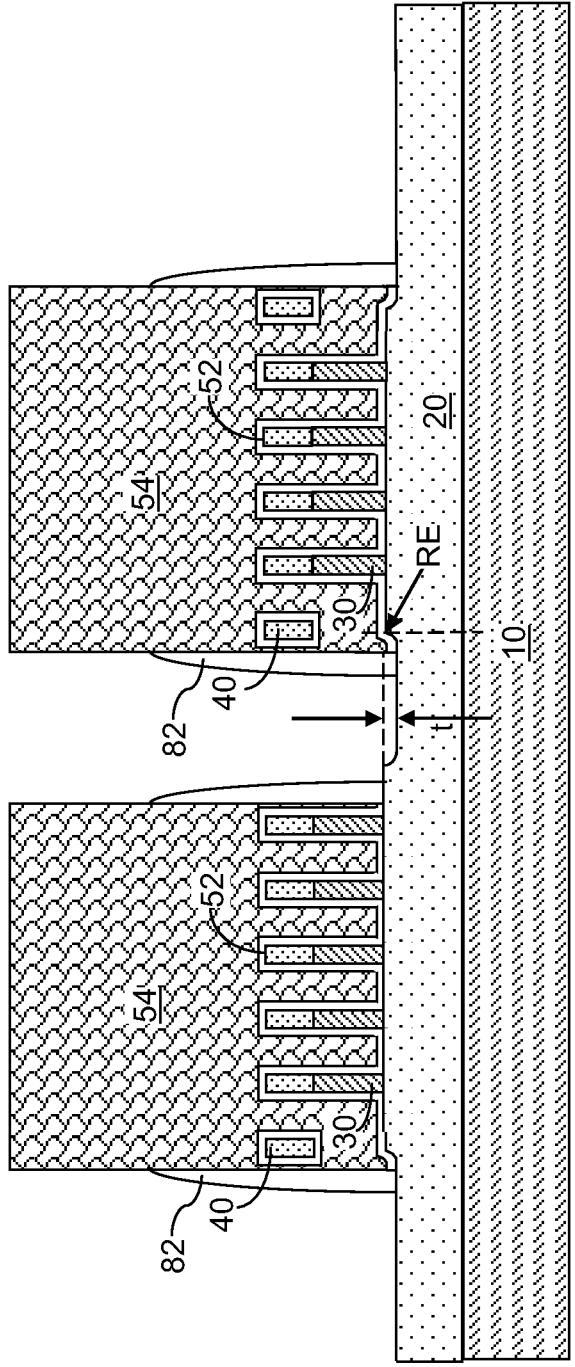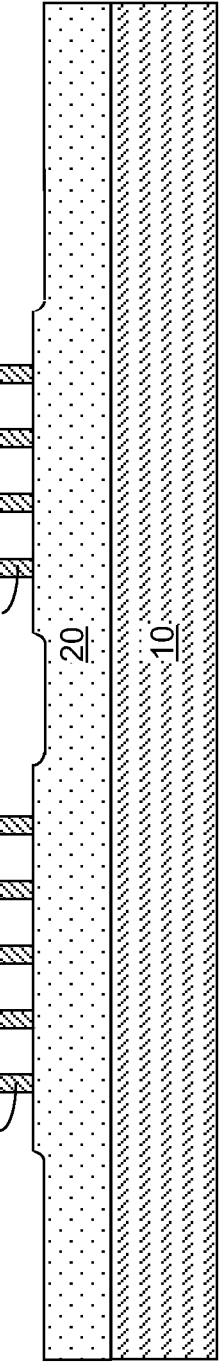
FIG. 14B
FIG. 15A

LOCAL TAILORING OF FINGERS IN MULTI-FINGER FIN FIELD EFFECT TRANSISTORS

BACKGROUND

The present disclosure relates to a semiconductor structure, and particularly to a method of locally tailoring the number of fingers in multi-finger fin field effect transistors, and structures formed by the same.

Fin field effect transistors (finFETs) provide advantage over conventional planar field effect transistors in terms of on-current per unit device area because sidewalls of semiconductor fins can be employed as the channel. In order to provide uniformity of widths among semiconductor fins, the semiconductor fins are formed as a dense one-dimensional array of semiconductor fins, and are subsequently patterned to provide a cluster of semiconductor fins laterally spaced from adjacent clusters of semiconductor fins.

Because the semiconductor fins have the same width and the same height in such cases, the on-current of a fin field effect transistor is determined by the number of semiconductor fins that a gate electrode straddles. Many semiconductor circuits, such as static random access memory circuits, require transistors having different on-currents. In such cases, the number of semiconductor fins in a single fin field effect transistor needs to be changed in order to provide transistors having different on-currents. Thus, it is necessary to locally cut semiconductor fins, i.e., to remove a portion of a long semiconductor fin in a region where a device with a reduced on-current needs to be formed.

Because the semiconductor fins are formed as a dense array, precise placement of a lithographic mask between semiconductor fins is a challenge, and causes significant level of reworks in lithographic processing and/or causes defective devices due to lithographic overlay problems, e.g., due to an unsuccessful cut or a cut that extends to a region where semiconductor fins should not be cut. Thus, a reliable method of cutting a semiconductor fin in a dense array of semiconductor fins is desired.

Because increasing the density of semiconductor fins enables greater layout density and reduced parasitic capacitance, fins are often patterned using sidewall image transfer processes, in which fins are located along the sidewalls of a mandrel shape. One property of the sidewall image transfer technique is that the number of fins formed is always even. Thus, the number of fins in a device may be increased or decreased by two by adding or removing a mandrel shape. However, an odd number of fins can only be formed by trimming. In this case, the ability to trim away a single fin is particularly important.

SUMMARY

A cluster of semiconductor fins is formed on an insulator layer. A masking material layer is formed over the cluster of semiconductor fins such that spaces between adjacent semiconductor fins are filled with the masking material layer. A photoresist layer is applied over the masking material layer, and is lithographically patterned such that a sidewall of the masking material layer is physically exposed in regions from which a portion of an outermost semiconductor fin is to be subsequently removed, while sidewalls of the masking material layer are covered by the photoresist layer in regions in which semiconductor fins are to be protected from cutting. The overlay tolerance for the lithographic patterning can be on the order of the dimension of a cluster of semiconductor fins along a widthwise direction of the semiconductor fins. The masking material layer is etched to physically expose a sidewall surface of a semiconductor fin in regions not covered by the photoresist layer. A recessed region is formed in the insulator layer such that an edge of the recessed region is formed within an area from which a portion of the semiconductor fin is removed. The photoresist layer and the masking material layer are removed. Within the cluster, a region is provided that has a lesser number of semiconductor fins than another region in which semiconductor fins are not etched.

According to an aspect of the present disclosure, a semiconductor structure is provided, which includes a stack of a semiconductor fin and a dielectric fin located on an insulator layer and extending along a lengthwise direction. A first semiconductor end wall of the semiconductor fin and a first dielectric end wall of the dielectric fin are vertically coincident with each other. A second dielectric end wall of the dielectric fin extends farther along the lengthwise direction than a second semiconductor end wall of the semiconductor fin.

According to another aspect of the present disclosure, another semiconductor structure is provided, which includes a semiconductor fin extending along a lengthwise direction and located on an insulator layer. The insulator layer includes a topmost surface and a recessed region including a recessed horizontal surface and a curved surface that adjoins the recessed horizontal surface and adjoins the topmost surface at a recess edge. The recess edge adjoins a bottom surface of the semiconductor fin.

According to yet another aspect of the present disclosure, a method of forming a semiconductor structure is provided. A plurality of stacks of a semiconductor fin and a dielectric fin is formed on an insulator layer. Each of the plurality of stacks extends along a lengthwise direction. A masking material layer is formed over the plurality of stacks. The masking material layer fills each volume between the plurality of stacks up to a topmost surface of the plurality of stacks. A patterned photoresist layer is formed over the masking material layer. A sidewall of the patterned photoresist layer contacts a portion of the masking material layer overlying the plurality of stacks. A portion of a sidewall of an outermost semiconductor fin among a plurality of semiconductor fins within the plurality of stacks is physically exposed by removing portions of the masking material layer that are not covered by the patterned photoresist layer. A portion of the outermost semiconductor fin is removed by etching the portion of the outermost semiconductor fin while a remaining portion of the masking material layer is present on the insulator layer.

BRIEF DESCRIPTION OF SEVERAL VIEWS OF THE DRAWINGS

FIG. 1 is a vertical cross-sectional view of an exemplary structure after formation of a dielectric layer on a semiconductor-on-insulator (SOI) substrate according to an embodiment of the present disclosure.

FIG. 2 is a vertical cross-sectional view of the exemplary semiconductor after formation of a plurality of mandrel structures according to an embodiment of the present disclosure.

FIG. 5 is a vertical cross-sectional view of the exemplary structure after removal of the plurality of mandrel structures according to an embodiment of the present disclosure.

FIG. 6A is a vertical cross-sectional view of the exemplary structure after formation of patterned portions of the dielectric layer and the semiconductor layer according to an embodiment of the present disclosure.

FIG. 9 is a vertical cross-sectional view of the exemplary structure after formation of a masking material layer according to an embodiment of the present disclosure.

FIG. 10A is a vertical cross-sectional view of the exemplary structure after formation of a patterned photoresist layer according to an embodiment of the present disclosure.

FIG. 14B is a vertical cross-sectional view of the exemplary structure of FIG. 14A along the vertical plane B-B'.

FIG. 15A is a vertical cross-sectional view of a variation of the exemplary structure after removal of dielectric fins according to an embodiment of the present disclosure.

DETAILED DESCRIPTION

Figure 3:
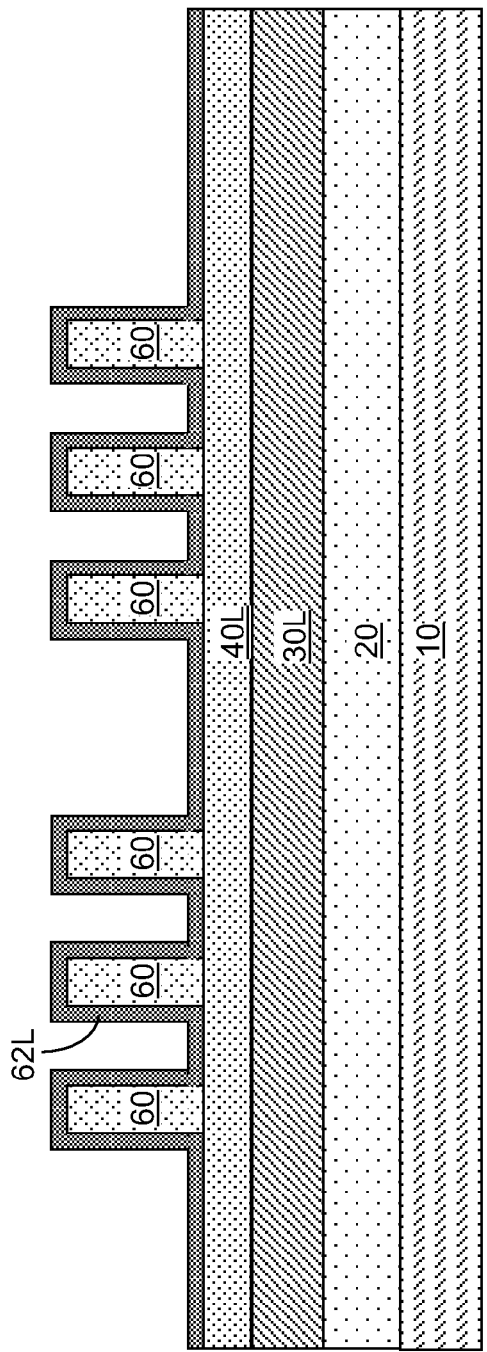
FIG. 3 is a vertical cross-sectional view of the exemplary structure after formation of a fin-defining dielectric layer according to an embodiment of the present disclosure.

As stated above, the present disclosure relates to a method of locally tailoring the number of fingers in multi-finger fin field effect transistors, and structures formed by the same. Aspects of the present disclosure are now described in detail with accompanying figures. It is noted that like reference numerals refer to like elements across different embodiments. The drawings are not necessarily drawn to scale.

Referring to FIG. 1, an exemplary structure according to an embodiment of the present disclosure includes a semiconductor substrate and a dielectric layer formed thereupon. In one embodiment, the semiconductor substrate can be a semiconductor-on-insulator (SOI) substrate including a stack, from bottom to top, of a handle substrate 10, a buried insulator layer 20, and a top semiconductor layer 30L.

The handle substrate 10 can include a semiconductor material, a conductive material, and/or a dielectric material. The handle substrate 10 provides mechanical support to the buried insulator layer 20 and the top semiconductor layer 30L. The thickness of the handle substrate 10 can be from 30 microns to 2 mm, although lesser and greater thicknesses can also be employed.

The buried insulator layer 20 is an insulator layer including a dielectric material such as silicon oxide, silicon nitride, silicon oxynitride, or a combination thereof. The thickness of the buried insulator layer 20 can be from 50 nm to 5 microns, although lesser and greater thicknesses can also be employed.

The top semiconductor layer 30L is a semiconductor material layer including a first semiconductor material. The first semiconductor material can be an elemental semiconductor material or a compound semiconductor material. For example, the first semiconductor material can be silicon, germanium, a silicon-germanium alloy, or a silicon-carbon alloy. The first semiconductor material may or may not be doped with p-type dopants and/or n-type dopants. The first semiconductor material can be a single crystalline semiconductor material, a polycrystalline semiconductor material, or an amorphous semiconductor material. In one embodiment, the first semiconductor material can be silicon. In one embodiment, the first semiconductor material can be single crystalline silicon. The thickness of the top semiconductor layer 30L can be from 10 nm to 200 nm, although lesser and greater thicknesses can also be employed.

The dielectric material of the dielectric layer 40L can be, for example, silicon oxide, silicon oxynitride, a dielectric metal oxide, or a combination thereof. The dielectric layer 40L can be formed, for example, by chemical vapor deposition (CVD) or conversion of a topmost portion of the top semiconductor layer 30L by thermal oxidation, thermal nitridation, plasma oxidation, plasma nitridation, or a combination thereof. The thickness of the dielectric layer 40L can be from 2 nm to 30 nm, although lesser and greater thicknesses can also be employed. Alternately, the dielectric layer 40L may be omitted, for example, in the case of trigate structures where a dielectric cap is not used over the semiconductor fins.

A mandrel material layer 60L is deposited over the dielectric layer 40L. The mandrel material layer 60L includes a material that can be removed selective to the materials of the dielectric layer 40L. In one embodiment, the mandrel material layer 60L can include amorphous silicon, polysilicon, amorphous or polycrystalline germanium, an amorphous or polycrystalline silicon-germanium alloy material, amorphous carbon, diamond-like carbon, or organosilicate glass. The thickness of the mandrel material layer 60L can be, for example, from 30 nm to 300 nm, although lesser and greater thicknesses can also be employed. The mandrel material layer 60L can be deposited, for example, by chemical vapor deposition (CVD).

Referring to FIG. 2, the mandrel material layer 60L is patterned to form a plurality of mandrel structures 60. The patterning of the mandrel material layer 60L can be performed, for example, by applying a photoresist layer (not shown) above the mandrel material layer 60L, lithographically patterning the photoresist layer to define a set of areas covered by the patterned photoresist layer, and transferring the pattern in the photoresist layer into the mandrel material layer 60L by an anisotropic etch. The anisotropic etch can be selective to the dielectric materials of the dielectric layer 40L. The patterned portions of the mandrel material layer are herein referred to as mandrel structures 60.

In one embodiment, the patterned photoresist layer and the mandrel dielectric layer 60L can have rectangular shapes as seen from above. In one embodiment, the rectangular shapes can be the same across a plurality of portions of the patterned photoresist layer, and across a plurality of mandrel structures. In one embodiment, the mandrel structures 60 can form at least one one-dimensional array of periodic patterns that is repeated along a horizontal direction. In one embodiment, the width of each mandrel structures 60 within a one-dimensional periodic pattern of the plurality of mandrel structures 60 can be less than the spacing between adjacent mandrel structures 60. Multiple one-dimensional periodic pattern including at least three mandrel structures 60 can be formed. In other words, the width of each mandrel structures 60 within a one-dimensional periodic pattern of the plurality of mandrel structures 60 can be less than one half of the pitch of the one-dimensional periodic pattern of the plurality of mandrel structures 60. In one embodiment, the width of each mandrel structures 60 within a one-dimensional periodic pattern of the plurality of mandrel structures 60 can be selected to be less than one half of the pitch of the one-dimensional periodic pattern of the plurality of mandrel structures 60 by the thickness of a fin-defining dielectric layer to be subsequently deposited on the plurality of mandrel structures 60.

Referring to FIG. 3, a fin-defining dielectric layer 62L is deposited on all physically exposed surfaces of the plurality of mandrel structures 60 and the dielectric layer 40L. Portions of the fin-defining dielectric layer 62L are subsequently employed to define shapes of semiconductor fins. The lateral thickness of the fin-defining dielectric layer 62L as measured on sidewalls of the plurality of mandrel structures 60 define the lateral width of each semiconductor fin to be subsequently formed. The locations of the semiconductor fins to be subsequently formed are defined by the locations of the vertical portions of the fin-defining dielectric layer 62L. Because the locations and features of the fin-defining dielectric layer 62 define locations and features of the semiconductor fins to be subsequently formed, the fin-defining dielectric layer 62 are herein referred to as a "fin-defining" dielectric layer.

The fin-defining dielectric layer 62L includes a dielectric material that is different from the dielectric material of the dielectric layer 40L. If the plurality of mandrel structures 60 includes a dielectric material, the fin-defining dielectric layer 62L includes a dielectric material that is different from the dielectric material of the plurality of mandrel structures 60. In one embodiment, the fin-defining dielectric layer 62L can include silicon nitride, a dielectric metal oxide (e.g., $HfO_2$), a dielectric metal nitride, or a dielectric metal oxynitride. The fin-defining dielectric layer 62L is deposited as a conformal layer, i.e., a layer having the same thickness at horizontal portions and at vertical portions. The fin-defining dielectric layer 62L can be deposited, for example, by low pressure chemical vapor deposition (LPCVD) or atomic layer deposition (ALD).

Figure 4:
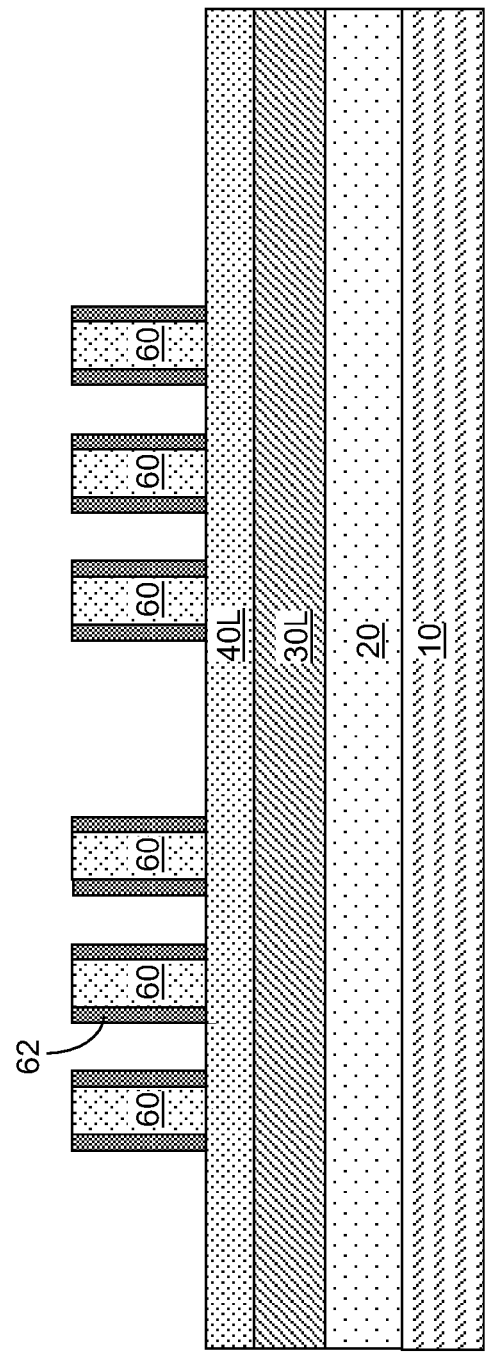
FIG. 4 is a vertical cross-sectional view of the exemplary structure after patterning the fin-defining dielectric layer into fin-defining dielectric spacers according to an embodiment of the present disclosure.

Referring to FIG. 4, the fin-defining dielectric layer 62L is anisotropically etched, for example, by a reactive ion etch (RIE), to form a plurality of fin-defining dielectric spacers 62. Specifically, the horizontal portions of the fin-defining dielectric layer 62L are etched through in an anisotropic etch until the top surfaces of the dielectric layer 40L are physically exposed. The remaining vertical portions of the fin-defining dielectric layer 62L after the anisotropic etch constitute the plurality of fin-defining dielectric spacers 62. The fin-defining dielectric spacers 62 have the same width throughout.

In one embodiment, the plurality of mandrel structures 60 can be a periodic one-dimensional array of periodic structures having a pitch, and the width of each portion of the fin-defining dielectric spacers 62 can be the same as one half of the pitch less the width of a mandrel structure 60. In one embodiment, each of the plurality of mandrel structures 60 can have a shape of a rectangular parallelepiped, and each of the plurality of fin-defining dielectric spacers 62 can have a cross-sectional shape of a rectangular ring, i.e., a three-dimensional object having a same horizontal cross-sectional area throughout such that the shape of the horizontal cross-sectional are is an area of a larger rectangle less an area of a smaller rectangle that has the same geometrical center as the larger rectangle. Further, the width of each fin-defining dielectric spacer 62 is the same throughout.

Referring to FIG. 5, the plurality of mandrel structures 60 is removed selective to the plurality of fin-defining dielectric spacers 62. For example, if the plurality of mandrel structures 60 includes a semiconductor material, the plurality of mandrel structures 60 can be removed by a wet etch that removes the semiconductor material while not removing the dielectric material of the plurality of fin-defining dielectric spacers 62.

Figure 6B:
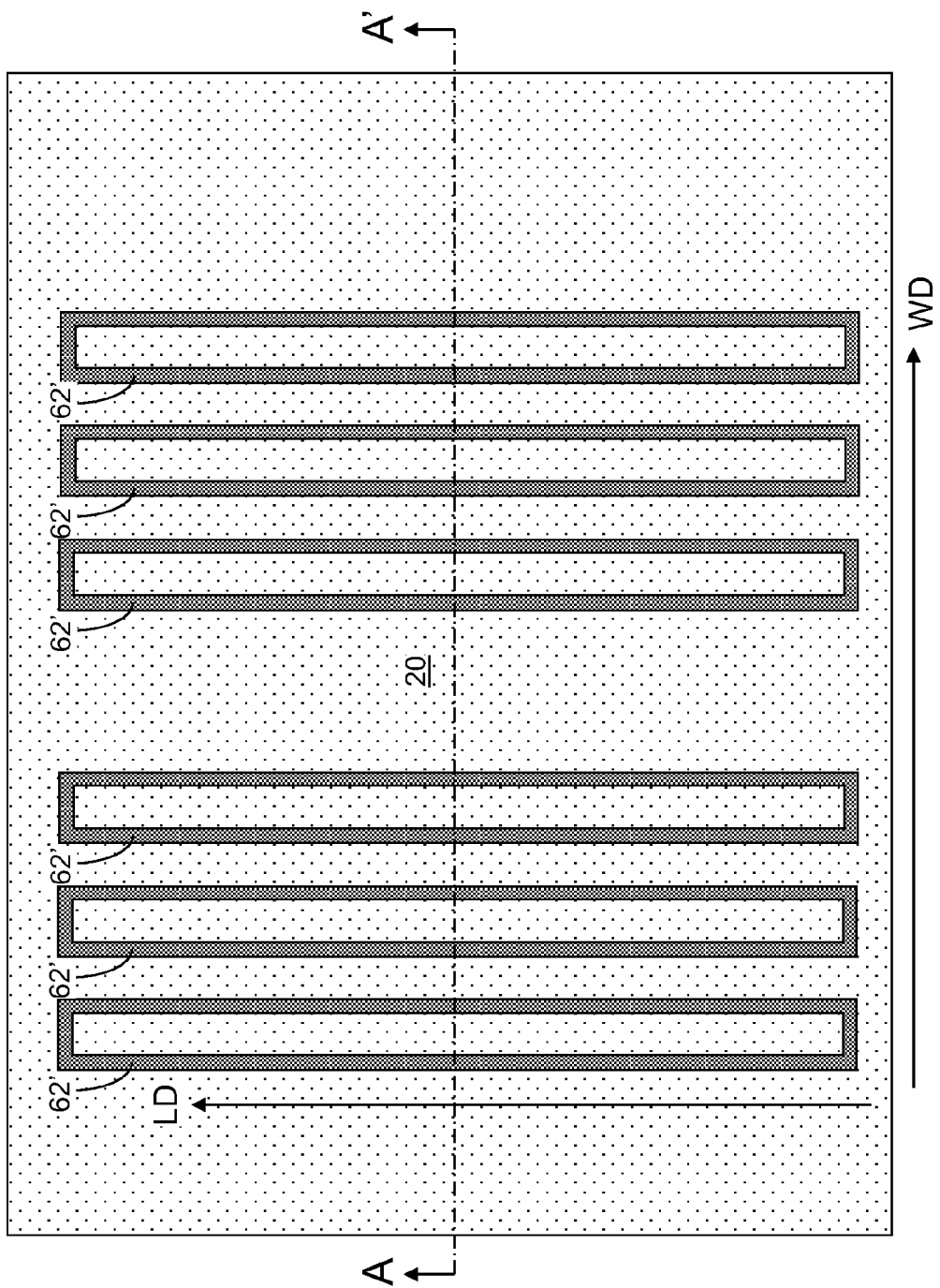
FIG. 6B is a top-down view of the exemplary structure of FIG. 6A. The vertical plane A-A' is the plane of the vertical cross-sectional view of FIG. 6A.

Referring to FIGS. 6A and 6B, the pattern in the plurality of fin-defining dielectric spacers 62 is transferred through the stack of the dielectric layer 40L and the top semiconductor layer 30L by an anisotropic etch that etches physically exposed portions of the dielectric layer 40L and the top semiconductor layer 30L. The dielectric layer 40L and the top semiconductor layer 30L are etched employing the plurality of fin-defining dielectric spacers 62 as an etch mask.

Vertical stacks, from bottom to top, of a semiconductor fin 30, a dielectric fin 40, and a cap dielectric fin 62' are formed on the top surface of the buried insulator layer 20. Each cap dielectric fin 62' is a remaining portion of a fin-defining dielectric spacer 62. Each dielectric fin 40 is a remaining portion of the dielectric layer 40L. Each semiconductor fin 30 is a remaining portion of the top semiconductor layer 30L. In other words, patterned portions of the top semiconductor layer 30L constitute the plurality of semiconductor fins 30. Within each vertical stack (30, 40, 62'), the semiconductor fin 30, the dielectric fin 40, and the cap dielectric fin 62' have the same horizontal cross-sectional area, which is the same as the horizontal cross-sectional area of the fin-defining dielectric spacer 62 from which the cap dielectric fin 62' is derived. In one embodiment, the buried insulator layer 20 can be employed as an etch stop layer for the anisotropic etch that forms the vertical stacks. Each vertical stack (30, 40, 62') can extend over a greater lateral dimension along a lengthwise direction LD than along a widthwise direction WD. As used herein, a "lengthwise direction" is a direction along two extremal portions of a structure that are farthest away from a center of gravity of the structure.

In one embodiment, all of the fin-defining dielectric spacers 62 can be consumed during the anisotropic etch that transfers the pattern of the fin-defining dielectric spacers 62. In this case, the cap dielectric fins 62' are not present over each vertical stack of a semiconductor fin 30 and a dielectric fin 40.

Figure 7A:
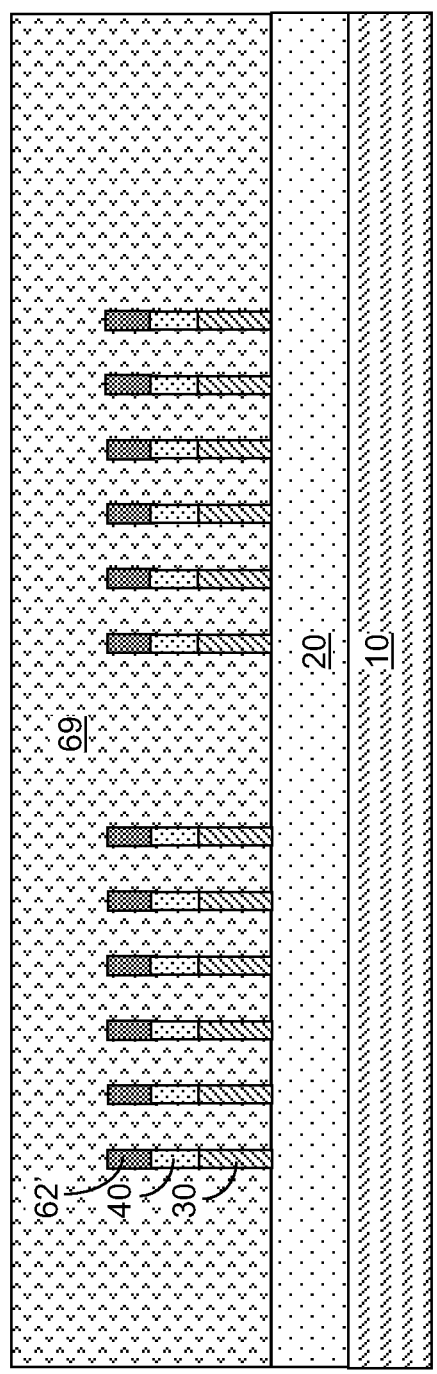
FIG. 7A is a vertical cross-sectional view of the exemplary structure after removal of end portions of the patterned portions of the dielectric layer and the semiconductor layer according to an embodiment of the present disclosure.
Figure 7B:
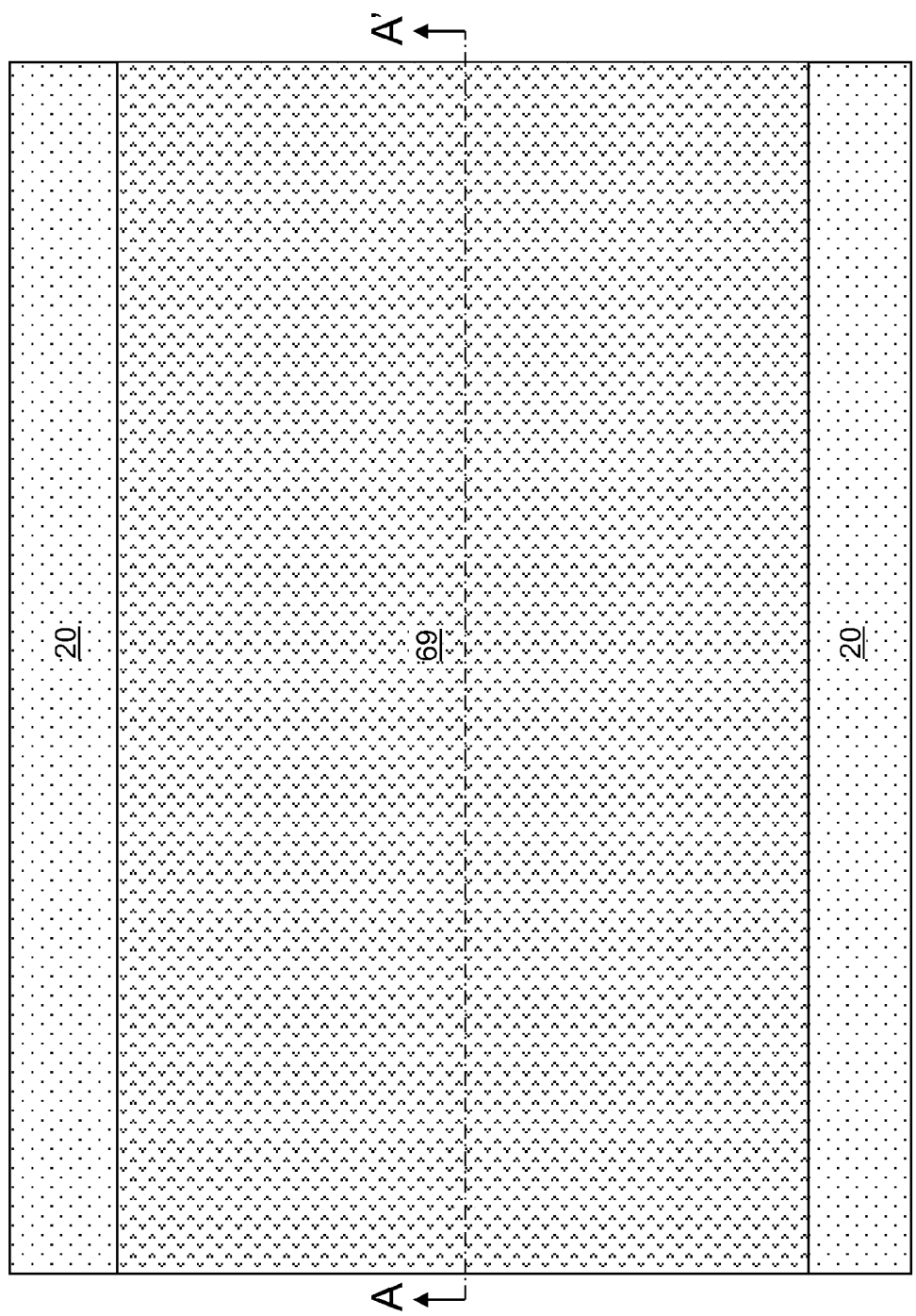
FIG. 7B is a top-down view of the exemplary structure of FIG. 10A. The vertical plane A-A' is the plane of the vertical cross-sectional view of FIG. 7A.

Referring to FIGS. 7A and 7B, a photoresist layer 69 can be applied over the plurality of vertical stacks (30, 40, 62'). The photoresist layer 69 is subsequently lithographically patterned to cover clusters of lengthwise portions of the vertical stacks (30, 40, 62') to be preserved to provide clusters remaining portions of the vertical stacks (30, 40, 62'), while physically exposing portions of the vertical stacks (30, 40, 62') to be removed.

In one embodiment, each of the plurality of vertical stacks (30, 40, 62') can have a horizontal cross-sectional area of a rectangular ring that extends over a greater lateral dimension along a lengthwise direction than along a widthwise direction that is perpendicular to the lengthwise direction. In one embodiment, end portions of each vertical stack (30, 40, 62') located along the lengthwise direction can be physically exposed after patterning of the photoresist layer 69.

The physically exposed end portions of each vertical stack (30, 40, 62') can be removed by an etch employing the photoresist layer 69 as an etch mask. The etch can be a wet etch or a dry etch. A vertical stack (30, 40, 62') having a horizontal cross-sectional area of a rectangular ring can be divided into two vertical stacks (30, 40, 62'), can be patterned into a single vertical stack (30, 40, 62'), or can be removed. After removal of the end portions of the vertical stacks (30, 40, 62') including the etched top semiconductor layer 30L (i.e., the semiconductor fins 30), the remaining portions of the etched top semiconductor layer 30L can include a plurality of semiconductor fins 30 that are parallel among one another. In one embodiment, all end walls of remaining portions of the plurality of vertical stacks (30, 40, 62') can be formed within a pair of vertical planes that are perpendicular to the lengthwise direction LD upon the removal of the end portions of the plurality of vertical stacks (30, 40, 62').

Figure 8:
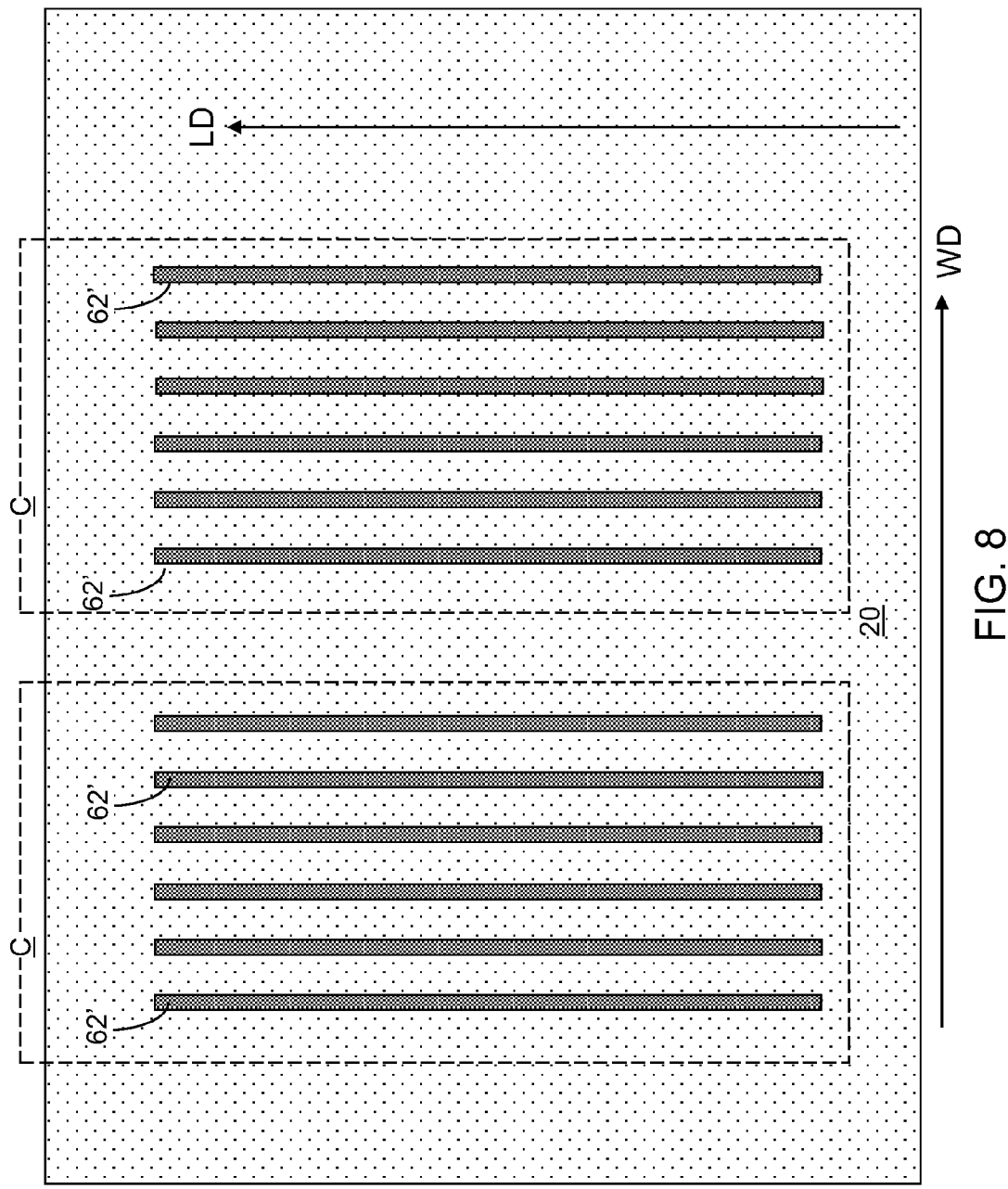
FIG. 8 is a top down view of the exemplary structure after removal of a photoresist layer according to an embodiment of the present disclosure.

Referring to FIG. 8, the photoresist layer 69 is subsequently removed, for example, by ashing. In one embodiment, each of the plurality of semiconductor fins 30 can extend over a greater horizontal distance along the lengthwise direction LD than along the widthwise direction WD. In one embodiment, each of the plurality of semiconductor fins 30 can have a rectangular cross-sectional shape. In one embodiment, each of the plurality of semiconductor fins 30 can be parallel to one another. In one embodiment, each of the plurality of parallel semiconductor fins 30 can have the same width along the widthwise direction WD. Alternately, the fin configuration in FIG. 8 may be directly patterned using advanced lithography, i.e. a resist could have been applied on the stack in FIG. 1, and patterned directly into the desired image using advanced lithography, and this image could have been transferred into the underlying stack.

A plurality of clusters C of vertical stacks (30, 40, 62') can be formed. Within each cluster C, the plurality of semiconductor fins 30 can be formed as a one-dimensional periodic array of semiconductor fins 30 having a pitch along the widthwise direction WD. The plurality of vertical stacks (30, 40, 62') extends over a greater horizontal distance along the lengthwise direction LD than along the widthwise direction WD. In one embodiment, each of the vertical stacks (30, 40, 62') can have a rectangular cross-sectional shape. Correspondingly, each of the plurality of semiconductor fins 30 can have the same rectangular cross-sectional shape.

For each of the plurality of semiconductor fins 30 in a cluster C of vertical stacks (30, 40, 62'), the semiconductor fin 30 has a pair of parallel lengthwise vertical sidewalls that extend along the lengthwise direction LD. Within each cluster C of vertical stacks (30, 40, 62'), the plurality of semiconductor fins 30 are parallel among one another. In one embodiment, each of the plurality of semiconductor fins 30 can have the same width along the widthwise direction WD.

Each dielectric fin 40 is located on top of one a semiconductor fin 30. The horizontal cross-sectional shape of a dielectric fin 40 is the same as the horizontal cross-sectional shape of the underlying semiconductor fin 30.

Within each cluster C of vertical stacks (30, 40, 62'), a plurality of vertical stacks (30, 40, 62') can be arranged as a one-dimensional periodic array of semiconductor fins having a pitch along the widthwise direction WD. Correspondingly, within each cluster C of vertical stacks (30, 40, 62'), a plurality of semiconductor fins 30 can be arranged as a one-dimensional periodic array of semiconductor fins having a pitch along the widthwise direction WD. Each of the semiconductor fins 30 can extend over a greater horizontal distance along the same lengthwise direction LD than along the same widthwise direction WD.

Referring to FIG. 9, a masking material layer 70L is formed over the plurality of vertical stacks (30, 40, 62'). The thickness of the masking material layer 70L is selected such that the masking material layer 70L fills each volume between the plurality of vertical stacks (30, 40, 62') up to a topmost surface of the plurality of vertical stacks (30, 40, 62'). The masking material layer 70L can be a dielectric material having a different composition from the composition of a plurality of dielectric fins 40 within the plurality of vertical stacks (30, 40, 62'). For example, the plurality of dielectric fins 40 can include silicon oxide and the masking material layer 70L can include silicon nitride, or vice versa. The masking material layer 70L can include the same material as, or a material different from, the cap dielectric fins 62' (if present). The masking material layer 70L can be deposited by chemical vapor deposition (CVD), atomic layer deposition (ALD), or other conformal deposition methods known in the art.

Figure 10B:
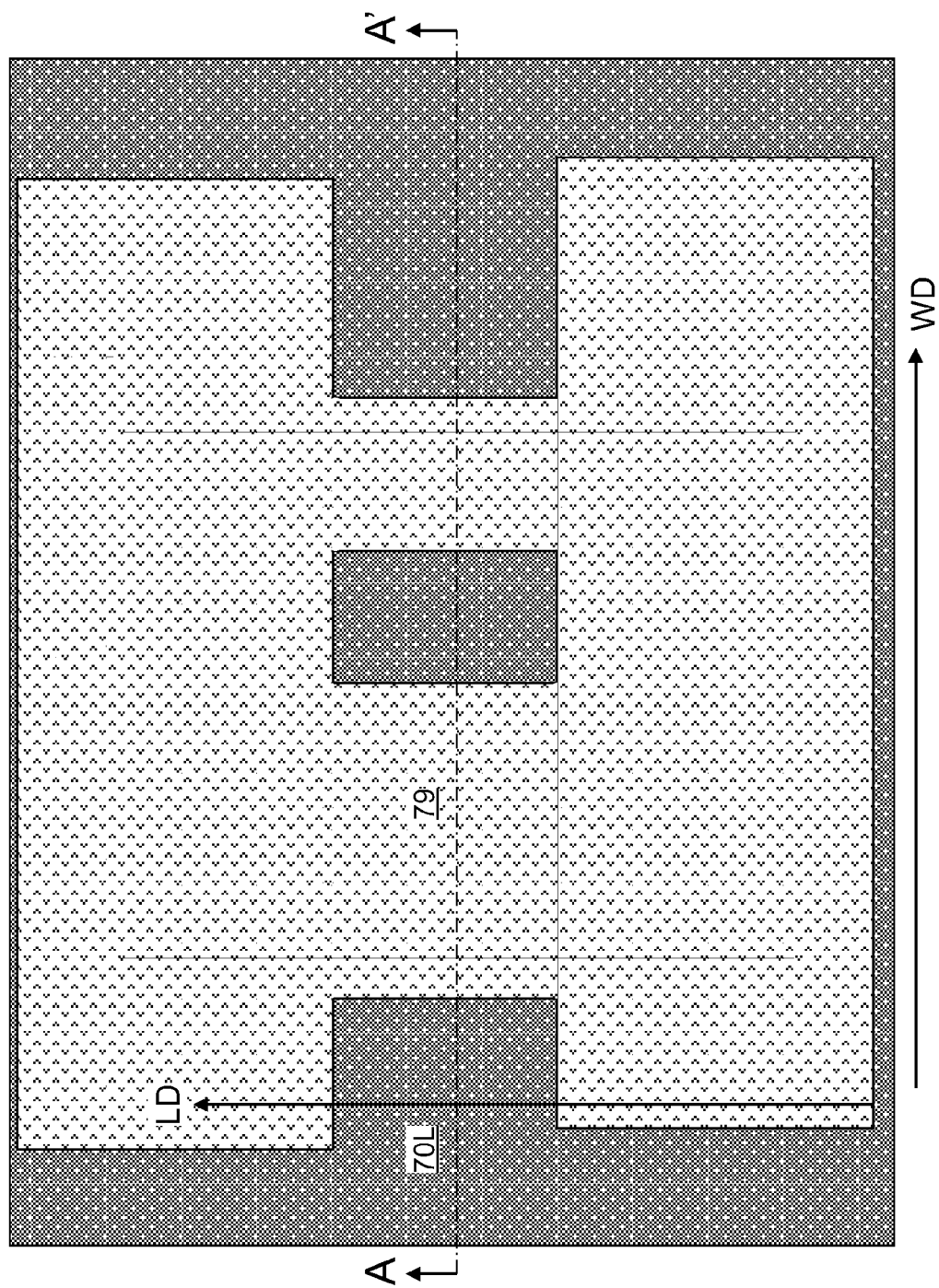
FIG. 10B is a top-down view of the exemplary structure of FIG. 10A. The vertical plane A-A' is the plane of the vertical cross-sectional view of FIG. 10A.

Referring to FIGS. 10A and 10B, a patterned photoresist layer 79 is formed over the masking material layer 70L. The patterned photoresist layer 79 can be formed by applying a blanket photoresist layer, and lithographically patterning the blanket photoresist layer by lithographic exposure and development. The patterned photoresist layer 79 is vertically and laterally spaced from the plurality of vertical stacks (30, 40, 62') by the masking material layer 70L.

The blanket photoresist layer can be patterned such that some of the sidewall of the patterned photoresist layer 79 can be within vertical planes that are parallel to the lengthwise direction LD of the plurality of semiconductor fins 30. Further, the blanket photoresist layer can be patterned such that the patterned photoresist layer 79 includes a sidewall that contacts a top surface of a portion of the masking material layer 70L that overlies the plurality of vertical stacks (30, 40, 62'). In one embodiment, a contiguous portion of the patterned photoresist layer 79 includes one sidewall that is parallel to the lengthwise direction LD of the plurality of semiconductor fins 30 and contacts a top surface of a portion of the masking material layer 70L that overlies the plurality of vertical stacks (30, 40, 62'), and another sidewall that is parallel to the lengthwise direction LD of the plurality of semiconductor fins 30 and contacts a top surface of a portion of the masking material layer 70L that does not overlie the plurality of vertical stacks (30, 40, 62') as illustrated by the left side portion of the patterned photoresist layer 79 in FIG. 10A. In one embodiment, a contiguous portion of the patterned photoresist layer 79 includes a pair of sidewalls that are parallel to the lengthwise direction LD of the plurality of semiconductor fins 30 and contacts a same top surface of a portion of the masking material layer 70L that overlies the plurality of vertical stacks (30, 40, 62') as illustrated by the right side portion of the patterned photoresist layer 79 in FIG. 10A.

In some embodiments, a sidewall of a vertical stack (30, 40, 62') among the plurality of vertical stacks (30, 40, 62') can be located between an outermost semiconductor fin and a vertical plane that includes a sidewall of the patterned photoresist layer 79 that is parallel to the lengthwise direction LD of the plurality of semiconductor fins 30. As used herein, an outermost semiconductor fin is a semiconductor fin located at one of the two outermost positions within each cluster C. (See FIG. 8). Thus, each cluster C includes two outermost semiconductor fins. A sidewall of the outermost semiconductor fin is an outermost sidewall among all sidewalls of semiconductor fins 30 that are present within the plurality of vertical stacks (30, 40, 62') within a cluster C (See FIG. 8).

In further embodiments, the entirety of a vertical stack (30, 40, 62') among the plurality of vertical stacks (30, 40, 62') can be located between an outermost semiconductor fin and a vertical plane that includes a sidewall of the patterned photoresist layer 79 that is parallel to the lengthwise direction LD of the plurality of semiconductor fins 30. For example, the vertical stack (30, 40, 62') located at the second position from the left in FIG. 10A is located between an outermost semiconductor fin (the leftmost semiconductor fin in FIG. 10A) and a vertical plane that includes a sidewall (i.e., the leftmost sidewall in FIG. 10A) of the patterned photoresist layer 79 that is parallel to the lengthwise direction LD of the plurality of semiconductor fins 30.

In one embodiment, at least one vertical plane that includes a sidewall of the patterned photoresist layer 79 that is parallel to the lengthwise direction LD of the plurality of semiconductor fins 30 can be between a pair of sidewalls of the vertical stack (30, 40, 62') that are parallel to the lengthwise direction LD. For example, two vertical planes corresponding to the two sidewalls of the right portion of the patterned photoresist layer 79 illustrated in FIG. 10A are between two outermost sidewalls of the plurality of vertical stack (30, 40, 62') within the right side cluster in FIG. 10A, which are a pair of sidewalls of the vertical stack (30, 40, 62') that are parallel to the lengthwise direction LD.

Figure 11:
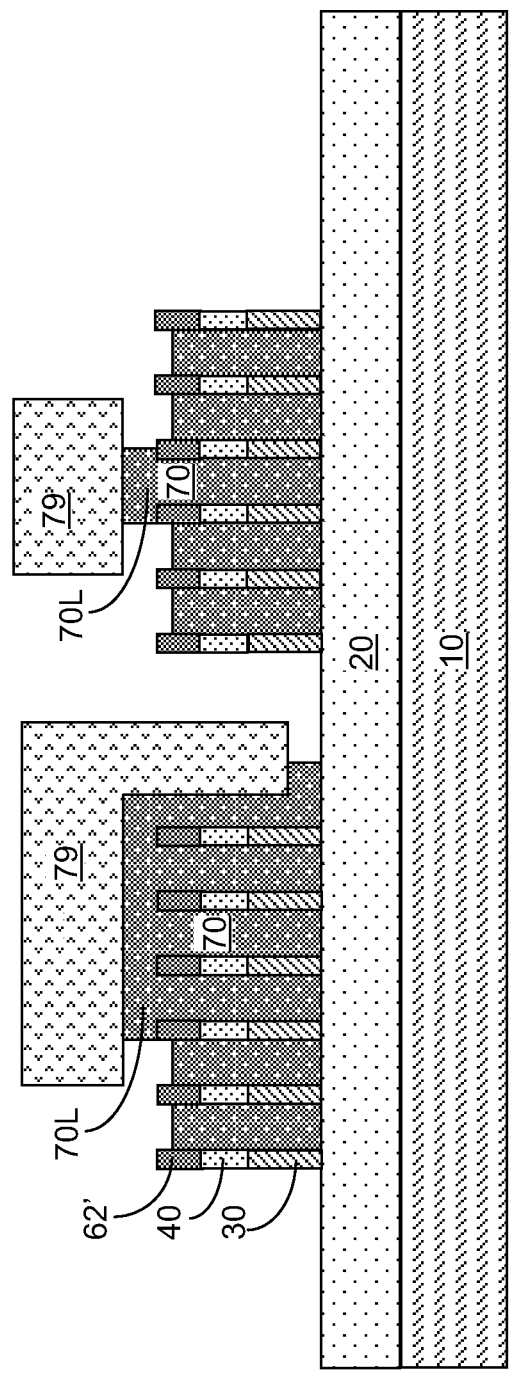
FIG. 11 is a vertical cross-sectional view of the exemplary structure after removing portions of the masking material layer that are not covered by the patterned photoresist layer according to an embodiment of the present disclosure.

Referring to FIG. 11, portions of the masking material layer 70L that are not covered by the patterned photoresist layer 79 can be removed by an etch, which can be an isotropic etch. A portion of a sidewall of an outermost semiconductor fin is physically exposed. The sidewall of the outermost semiconductor fin that includes a physically exposed portion is an outermost sidewall of a cluster C of vertical stack (30, 40, 62'). The masking material layer 70L can contact another portion (i.e., a portion that is not physically exposed) of the outermost sidewall of the outermost semiconductor fin.

The duration of the etch is controlled such that the masking material portions 70L contacts the entirety of another sidewall of the outermost semiconductor fin after the outermost sidewall of the outermost semiconductor fin is physically exposed. A recessed top surface of remaining portions of the masking material layer 70L can be located between a horizontal plane of a topmost surface of semiconductor fins 30 within the plurality of vertical stacks (30, 40, 62') and a horizontal plane of a topmost surface of cap dielectric fins 62' within the plurality of vertical stacks (30, 40, 62'). If cap dielectric fins are not present, a recessed top surface of remaining portions of the masking material layer 70L can be located between a horizontal plane of a topmost surface of semiconductor fins 30 within the plurality of vertical stacks (30, 40, 62') and a horizontal plane of a topmost surface of dielectric fins 40 within the plurality of vertical stacks (30, 40).

In one embodiment, a portion of a sidewall of another outermost semiconductor fin among the plurality of semiconductor fins 30 can be physically exposed by removing portions of the masking material layer 70L that are not covered by the patterned photoresist layer 79. For example, portions of two outermost semiconductor fins are physically exposed within the cluster of vertical stacks (30, 40, 62') located in the right side of the exemplary structure in FIG. 11.

Figure 12:
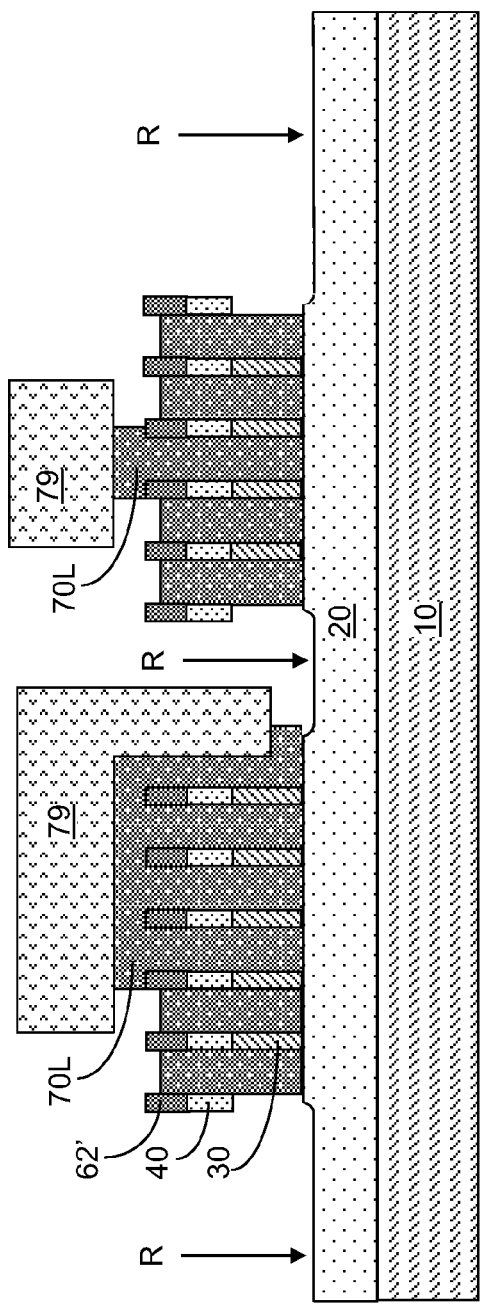
FIG. 12 is a vertical cross-sectional view of the exemplary structure after removal of physically exposed portions of outermost semiconductor fins according to an embodiment of the present disclosure.

Referring to FIG. 12, physically exposed portions of outermost semiconductor fins are removed, for example, by an isotropic etch. Specifically, a portion of each physically exposed outermost semiconductor fin can be removed by etching the physically exposed portions of the outermost semiconductor fin, while a remaining portion of the masking material layer 70L is present on the buried insulator layer 20.

The removal of the semiconductor material of the outermost semiconductor fins can be performed selective to the dielectric material of the plurality of dielectric fins 40. In this case, a portion of a outermost semiconductor fin can be removed from underneath an outermost dielectric fin among the plurality of vertical stacks (30, 40, 62'). An exemplary wet etch for removing semiconductor materials selective to dielectric materials is a potassium hydroxide (KOH) etch. Other etch chemistries for removing a semiconductor material selective to dielectric materials can also be employed.

In one embodiment, a first remaining portion of the outermost semiconductor fin and a second remaining portion of the outermost semiconductor fin can be laterally spaced from each other, and can contact a bottom surface of an overlying outermost dielectric fin after the etching of the physically exposed portion of the outermost semiconductor fin.

In some embodiments, a portion of at least another outermost semiconductor fin can be removed by simultaneously etching the portion of the at least another outermost semiconductor fin, while the remaining portion of the masking material layer 70L is present on the buried insulator layer 20. For example, portions of two outermost semiconductor fins are simultaneously etched within the cluster of vertical stacks (30, 40, 62') located in the right side of the exemplary structure in FIG. 12. All other semiconductor fins among the plurality of semiconductor fins that are located between the two outermost semiconductor fins within a cluster of vertical stacks (30, 40, 62') are not etched during the etching of the portions of the outermost semiconductor fins.

Concurrently with the etching of the portion(s) of the outermost semiconductor fin(s), recessed region R are formed in the buried insulator layer 20 by etching physically exposed portions of the buried insulator layer 20. The etching of the physically exposed portions of the buried insulator layer 20 is a collateral etch, i.e., an etch that is a collateral consequence of the etch that removes the physically exposed portions of the outermost semiconductor fin(s).

Each recessed region R can include a recessed horizontal surface and a curved surface that adjoins the recessed horizontal surface. The curved surface adjoins a topmost surface of the buried insulator layer 20 at a recess edge RE, which can be a straight line along the lengthwise direction LD of the plurality of semiconductor fins 30. Each recess edge adjoins a bottom surface of an outermost semiconductor fin. The locations of recess edges RE are illustrated as dotted lines in FIG. 13B.

Figure 13A:
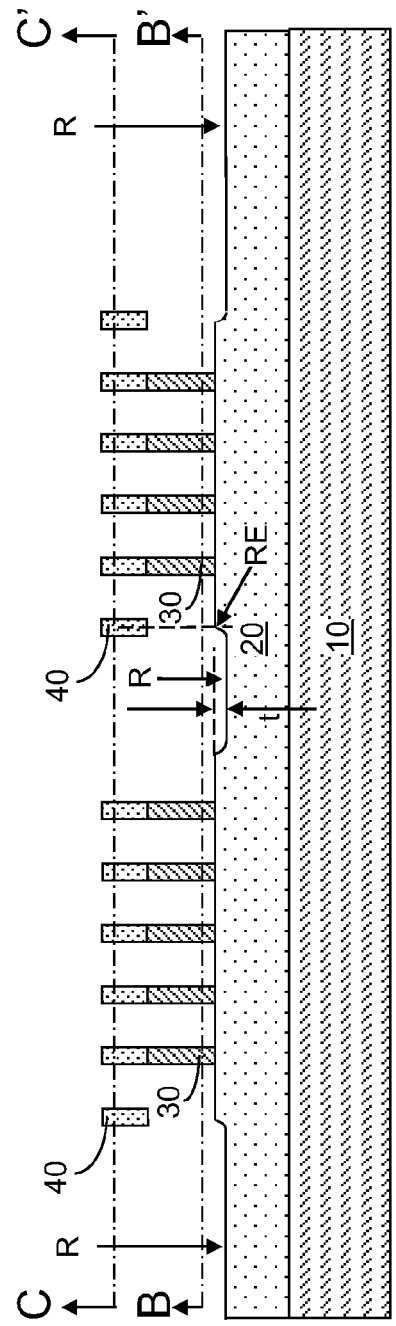
FIG. 13A is a vertical cross-sectional view of the exemplary structure after removal of the patterned photoresist layer and the masking material layer according to an embodiment of the present disclosure.
Figure 13B:
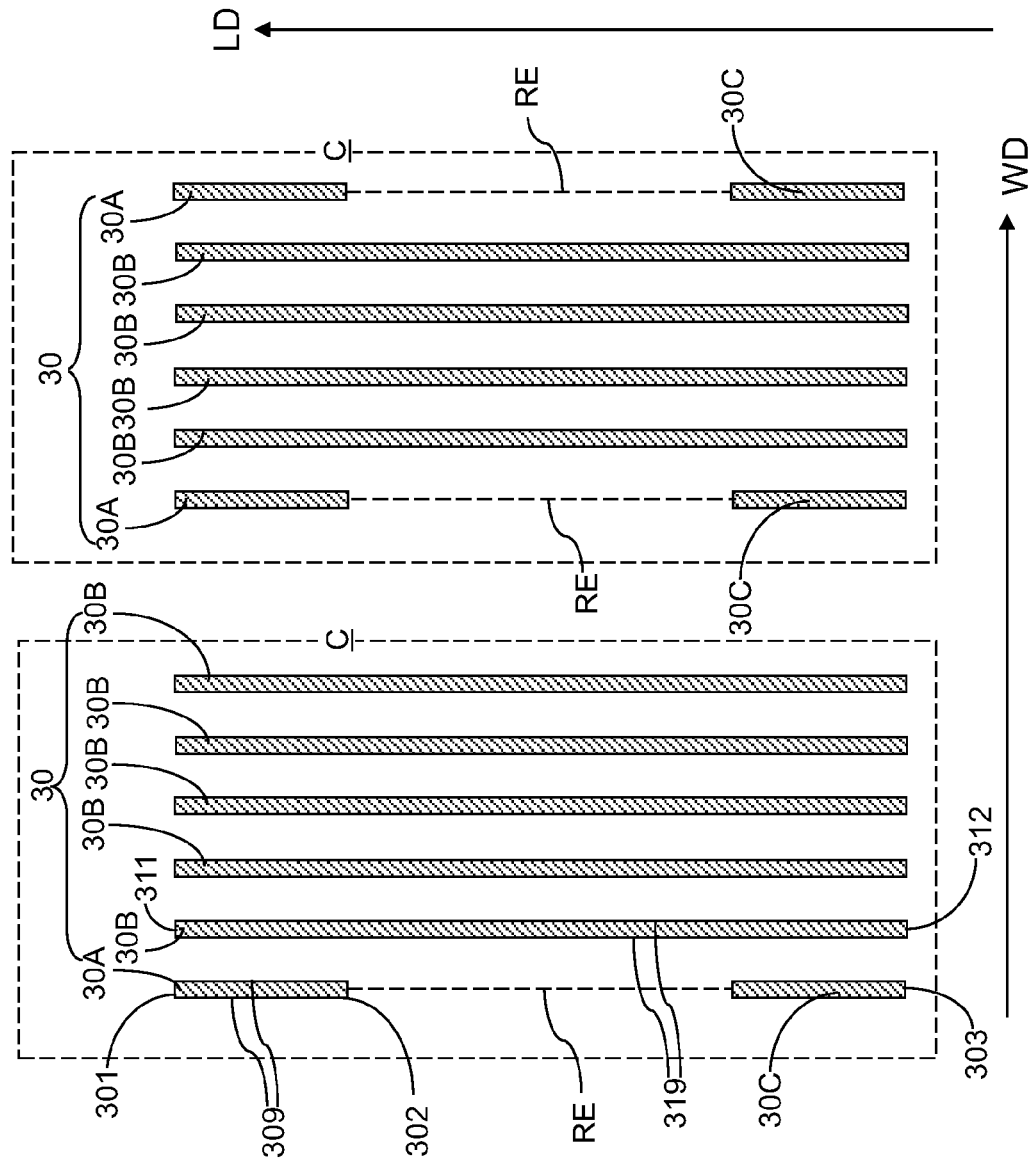
FIG. 13B is a horizontal cross-sectional view of the exemplary structure of FIG. 13A along the horizontal plane B-B'.
Figure 13C:
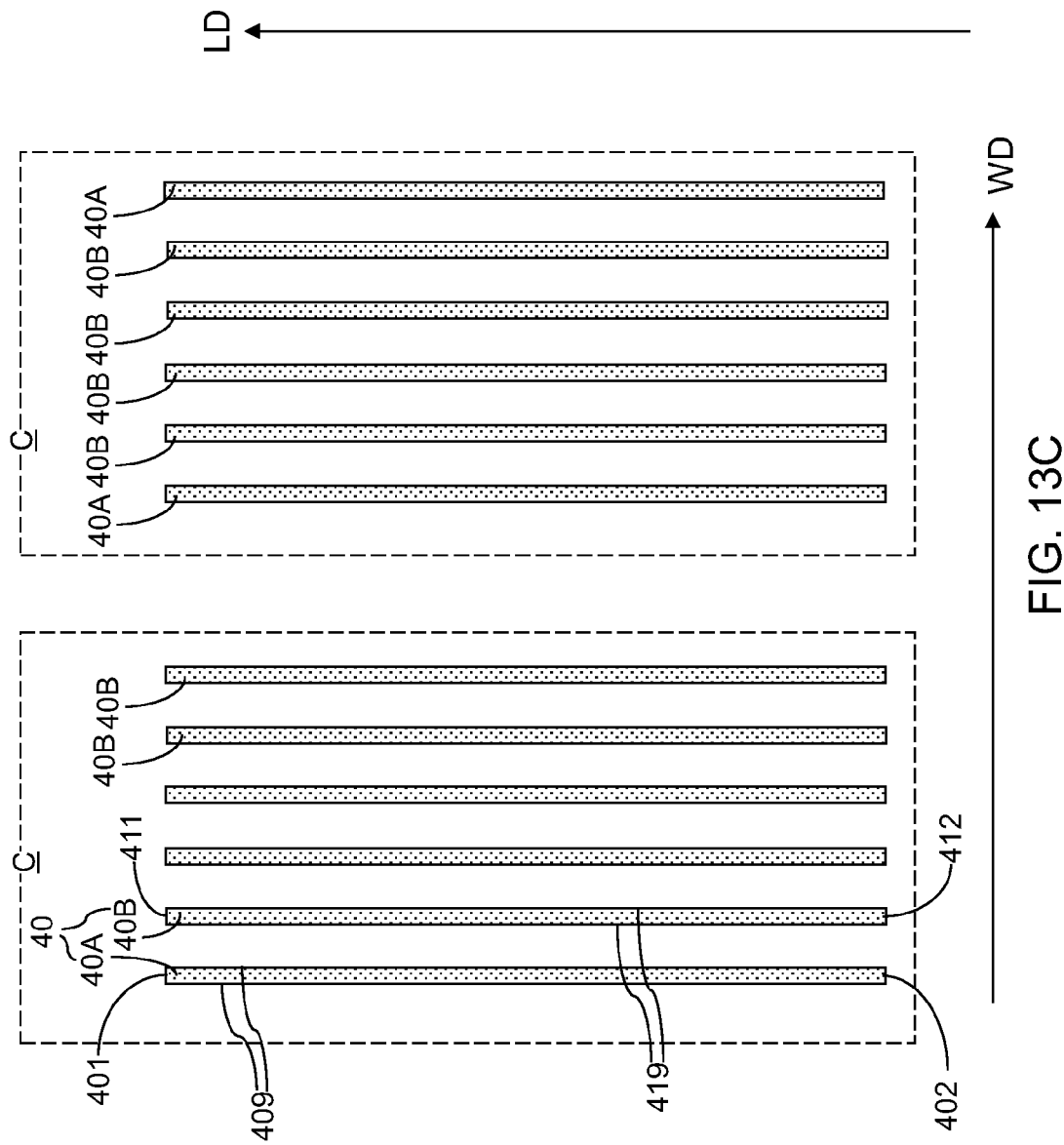
FIG. 13C is a horizontal cross-sectional view of the exemplary structure of FIG. 13A along the horizontal plane C-C'.

Referring to FIGS. 13A, 13B, 13C, the patterned photoresist layer 79 and the masking material layer 70L are removed selective to the semiconductor material of the plurality of semiconductor fins 30. The removal of the patterned photoresist layer 79 can be effected, for example, by ashing. The removal of the masking material layer 70L can be performed, for example, by an etch that is selective to the semiconductor material of the plurality of semiconductor fins 30 and the dielectric material of the buried insulator layer 20. Optionally, the removal of the masking material layer 70L can be selective to the plurality of dielectric fins 40. For example, if the buried insulator layer 20 and the plurality of dielectric fins 40 include silicon oxide, and if the masking material layer 70L and the cap dielectric fins 62' (if present) includes silicon nitride, a wet etch employing hot phosphoric acid can be employed to remove the masking material layer 70L and the cap dielectric fins 62' (if present) selective to the semiconductor material of the plurality of semiconductor fins 30, the plurality of dielectric fins 40, and the buried insulator layer 20.

The exemplary structure illustrated in FIGS. 13A, 13B, and 13C includes different types of semiconductor fins (30A, 30B, 30C). It is noted that reference numerals 30A, 30B, and 30C refer to different types of semiconductor fins 30. Further, reference numerals 40A and 40B refer to different types of dielectric fins 40.

Within the exemplary structure is a stack (30A, 40A) of a semiconductor fin 30A and a dielectric fin 40A located on an insulator layer, i.e., the buried insulator layer 20, and extending along a lengthwise direction, i.e., the lengthwise direction LD. A first semiconductor end wall 301 of the semiconductor fin 30A and a first dielectric end wall 401 of the dielectric fin 40A are vertically coincident with each other, and a second dielectric end wall 402 of the dielectric fin 40A extends farther along the lengthwise direction LD than a second semiconductor end wall 302 of the semiconductor fin 30A. As used herein, a first surface and a second surface are vertically coincident with each other if the first surface and the second surface are located within a same vertical plane. A pair of semiconductor sidewalls 309 of the semiconductor fin 30A is vertically coincident with a pair of dielectric sidewalls 409 of the dielectric fin 40A and extends along the lengthwise direction LD.

A second stack (30B, 40B) of a second semiconductor fin 30B and a second dielectric fin 40B can be located on the buried insulator layer 20 and laterally spaced from the stack (30A, 40A) by a uniform distance. As used herein, a first element and a second element are laterally spaced by a uniform distance if the shortest lateral distance between the first element and the second element is invariant under a translation along a horizontal direction. A third semiconductor end wall 411 of the second semiconductor fin 30B and a third dielectric end wall 411 of the second dielectric fin 40B are vertically coincident with each other, and a fourth semiconductor end wall 312 of the second semiconductor fin 30B and a fourth dielectric end wall 412 of the second dielectric fin 40B are vertically coincident with each other. The entirety of the second semiconductor fin 30B can contact the topmost surface of the buried insulator layer 20.

The second dielectric end wall 402, the fourth semiconductor end wall 302, and the fourth dielectric end wall 412 can be located within a planar (not-curved) vertical plane. Further, the first semiconductor end wall 301, the first dielectric end wall 401, the third semiconductor end wall 311, and the third dielectric end wall 411 can be located within another planar vertical plane.

The exemplary structure further includes another semiconductor fin 30C located on the buried insulator layer 20 and underlying the dielectric fin 40A. The semiconductor fin 30A and the other semiconductor fin 30C are laterally spaced from each other along the lengthwise direction LD. The other semiconductor fin 30C can include another semiconductor end wall 303 that is vertically coincident with the second dielectric end wall 402 of the dielectric fin 40.

In one embodiment, the removed portion of the outermost semiconductor fin, i.e., the semiconductor fin from which the semiconductor fin 30A and the semiconductor fin 30C are derived, can be between, and laterally spaced from, a first vertical plane including the first semiconductor end wall 301, the first dielectric end wall 401, the third semiconductor end wall 311, and the third dielectric end wall 411 and a second vertical plane including the second dielectric end wall 402, the fourth semiconductor end wall 302, and the fourth dielectric end wall 412.

In general, in addition to the stack (30A, 40A) of a semiconductor fin 30A and a dielectric fin 40A, at least another stack (30B, 40B) can be provided on the buried insulator layer 20 in the exemplary structure. Each of the at least another stack (30B, 40B) includes another semiconductor fin 30B and another dielectric fin 40B. A lateral extent of each of the at least another stack (30B, 40B) along the lengthwise direction LD can be from a first vertical plane including the first semiconductor end wall 301 and the first dielectric end wall 401 to a second vertical plane including the second dielectric end wall 402. The at least another stack (30B, 40B) can be a plurality of stacks (30B, 40B) that forms an array of periodic structures having a periodicity along a horizontal direction perpendicular to the lengthwise direction LD. In one embodiment, a lateral spacing between the stack (30A, 40A) and a most proximate stack among the plurality of stacks (30B, 40B) can be the same as a lateral spacing among the plurality of stacks (30B, 40B).

The buried insulator layer 20 can include a topmost surface and a recessed region R including a recessed horizontal surface and a curved surface that adjoins the recessed horizontal surface and adjoins the topmost surface at a recess edge RE. The recess edge RE adjoins a bottom surface of the semiconductor fin 30A. In an embodiment in which a semiconductor fin 30C is not formed underneath a portion of the dielectric fin 40A that includes the second dielectric end wall 402 (for example, by altering the pattern of the patterned photoresist layer 79), the recess edge RE can be parallel to the lengthwise direction LD and can extend to a vertical plane including the second dielectric end wall 402 and the fourth semiconductor end wall 312.

Figure 14A:
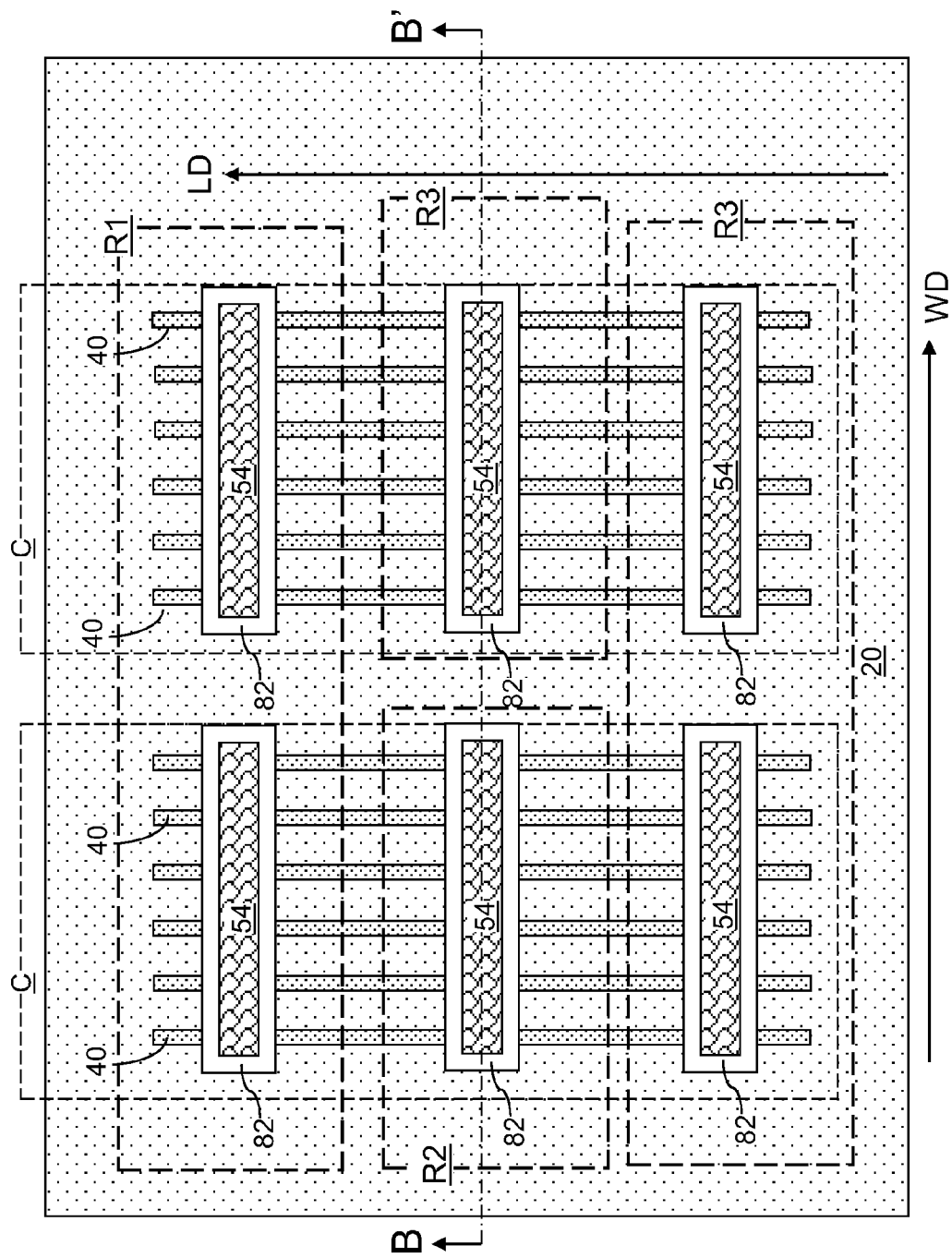
FIG. 14A is a top-down view of the exemplary structure after formation of gate dielectrics, gate electrodes, and gate spacers according to an embodiment of the present disclosure.

Referring to FIGS. 14A and 14B, gate dielectrics 52, gate electrodes 54, and gate spacers 82 can be subsequently formed. One of the gate dielectrics 52 can contact a bottom surface of a portion of the dielectric fin 40A that extends farther along the lengthwise direction than a second semiconductor end wall 302 (See FIG. 13B) of the semiconductor fin 30A (See FIG. 13B). One of the gate electrodes 54 overlying the portion of the dielectric fin 40A that extends farther along the lengthwise direction than the second semiconductor end wall 302 of the semiconductor fin 30A.

Figure 15B:
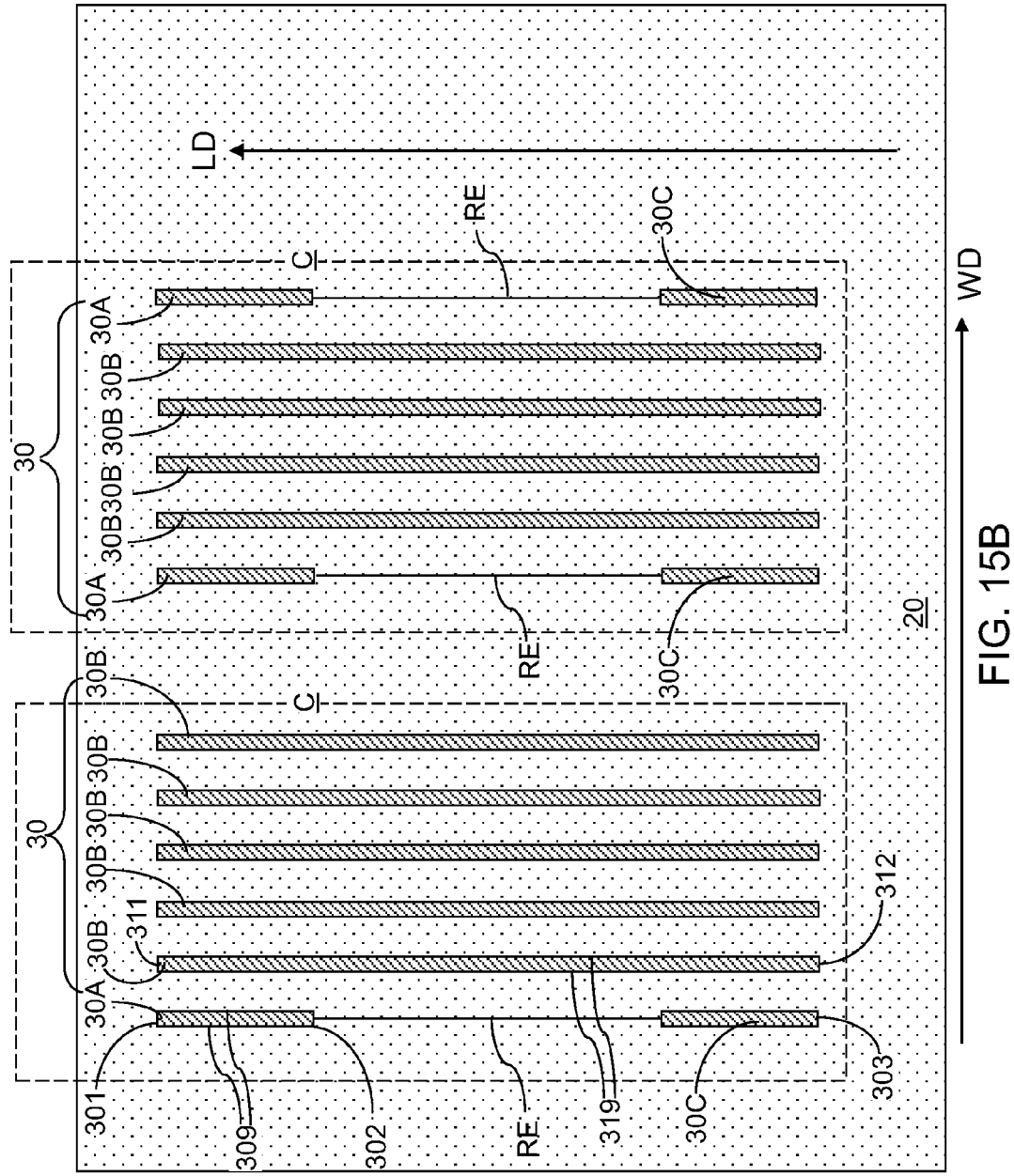
FIG. 15B is a top-down view of the variation of the exemplary structure of FIG. 15A.

Referring to FIGS. 15A and 15B, a variation of the exemplary structure can be derived from the exemplary structure shown in FIGS. 13A, 13B, and 13C by removing the dielectric fins 40 selective to the semiconductor fins (30A, 30B, 30C). A semiconductor fin 30A extending along a lengthwise direction LD is located on the buried insulator layer 20. The buried insulator layer 20 includes a topmost surface and a recessed region. The recessed region includes a recessed horizontal surface and a curved surface. The curves surface adjoins the recessed horizontal surface and adjoins the topmost surface at a recess edge RE. The recess edge RE adjoins a bottom surface of the semiconductor fin 30A. The recess edge RE is parallel to the lengthwise direction LD.

A second semiconductor fin 30B is located on the buried insulator layer 20 and is laterally spaced from the semiconductor fin 30A by a uniform distance along a horizontal direction perpendicular to the lengthwise direction LD. The semiconductor fin 30A has a first semiconductor end wall 301 and a second semiconductor end wall 302 that are perpendicular to the lengthwise direction LD. The second semiconductor fin 30B has a third semiconductor end wall 311 and a fourth semiconductor end wall 312 that are perpendicular to the lengthwise direction LD. The first semiconductor end wall 301 and the third semiconductor end wall 311 can be located within a same vertical plane. A recess edge RE can extend from a vertical plane including the second semiconductor end wall along the lengthwise direction LD.

A plurality of semiconductor fins 30B that forms an array of periodic structures can be present. The plurality of semiconductor fins 30B can have a periodicity along a horizontal direction perpendicular to the lengthwise direction LD. A lateral spacing between semiconductor fin 30A and a most proximate semiconductor fin among the plurality of semiconductor fins 30B can be the same as the lateral spacing among the plurality of semiconductor fins 30B. Each of the semiconductor fins (30A, 30B, 30C) can include a single crystalline semiconductor material.

Figure 16A:
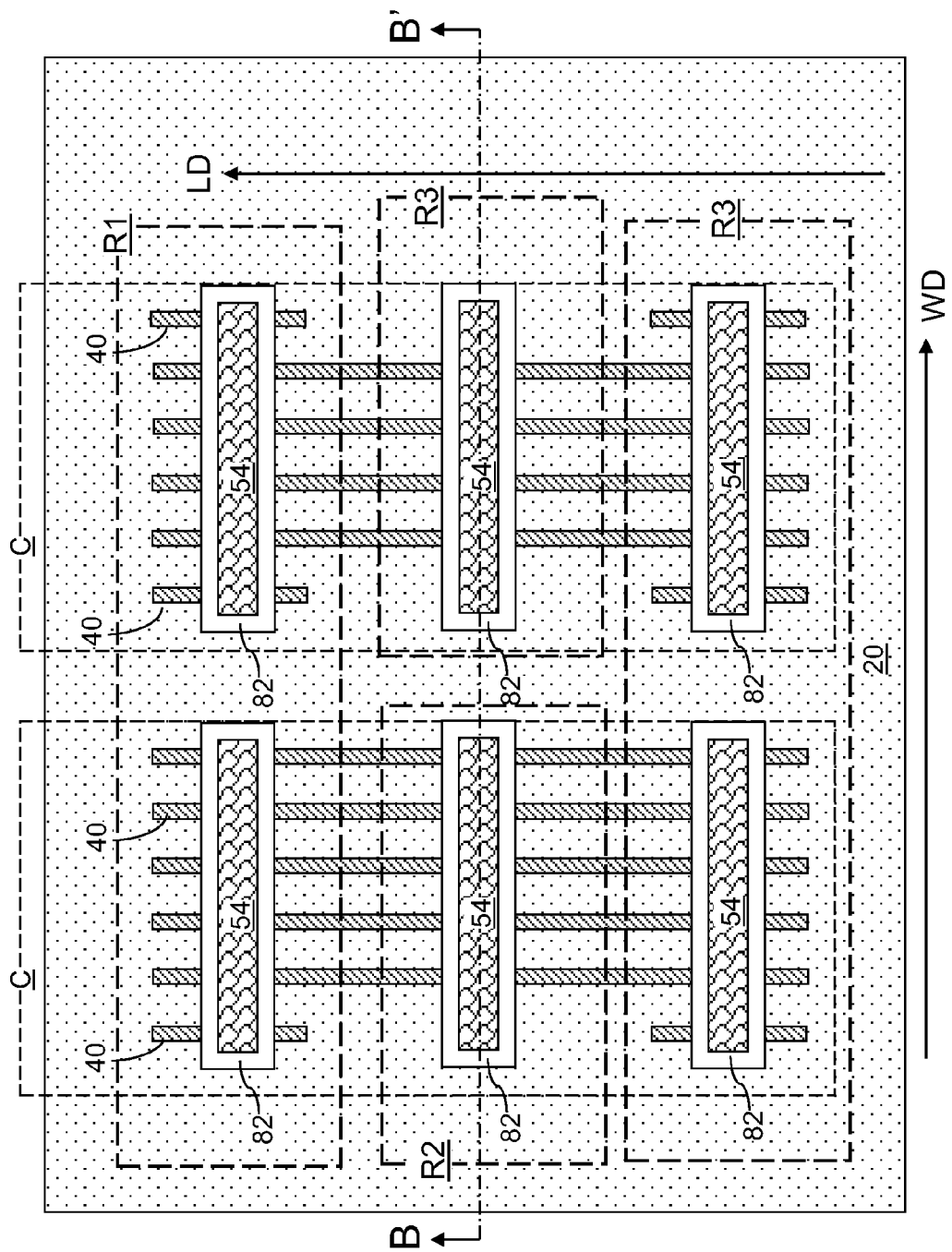
FIG. 16A is a top-down view of the variation of the exemplary structure after formation of gate dielectrics, gate electrodes, and gate spacers according to an embodiment of the present disclosure.
Figure 16B:
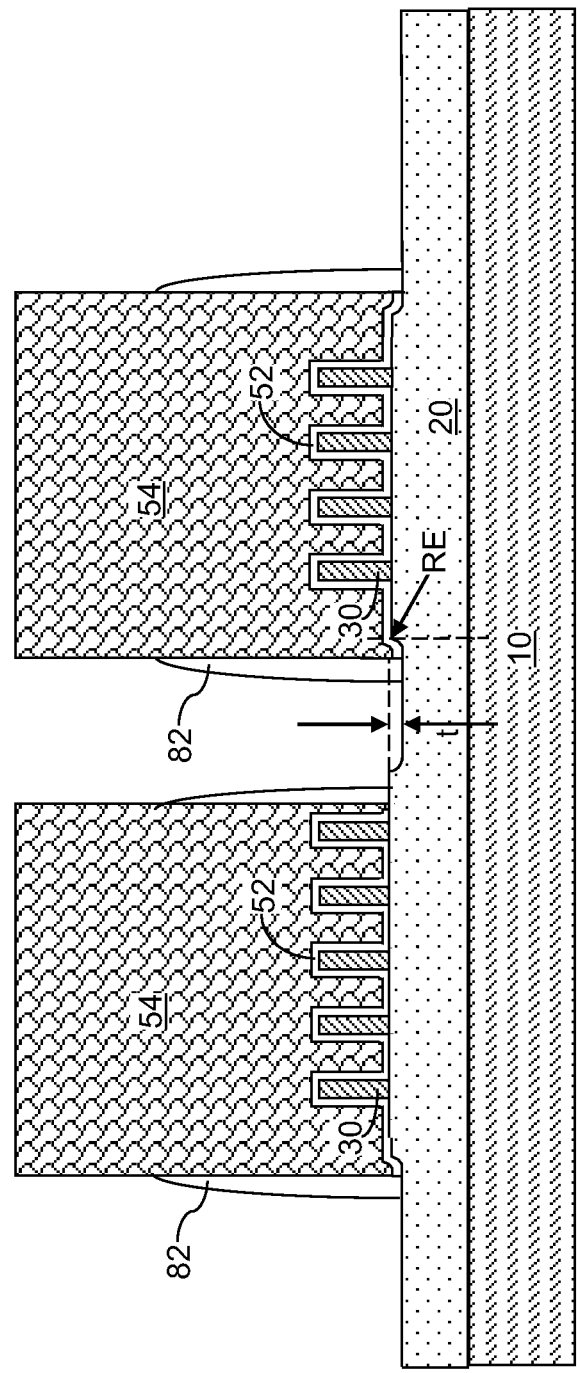
FIG. 16B is a vertical cross-sectional view of the variation of the exemplary structure of FIG. 16A along the vertical plane B-B'.

Referring to FIGS. 16A and 16B, gate dielectrics 52, gate electrodes 54, and gate spacers 82 can be subsequently formed. A first gate electrode (e.g., one of the two gate electrodes 54 at the top or one of the two gate electrodes 54 at the bottom) straddles a portion of the semiconductor fin 30A and the second semiconductor fin 30B (See FIG. 15B) between the vertical plane including the first semiconductor end wall 301 and the third semiconductor end wall 311 and a vertical plane including the second semiconductor end wall 302. A second gate electrode (e.g., one of the two middle gate electrodes 54) straddles a portion of the second semiconductor fin 30B (See FIG. 15B) between the vertical plane including the second semiconductor end wall 302 and another vertical plane including the fourth semiconductor end wall 312. The gate dielectrics 53 can contact the topmost surface, the recessed horizontal surface, and the curved surfaces within the recessed region of the buried insulator layer 20.

The methods of the present disclosure enable removal of a portion of a single semiconductor fin or two semiconductor fins from a cluster of semiconductor fins 30, which may be arranged in a one-dimensional array with a minimum lithographic pitch or a sublithographic pitch, i.e., a pitch that cannot be printed by a single lithographic exposure. The methods of the present disclosure can be employed to remove a portion of a single outermost semiconductor fin, or portions of two outermost semiconductor fins, irrespective of the pitch of the one-dimensional array of semiconductor fins within a cluster. Thus, the methods of the present disclosure can be particularly useful in providing local tailoring of the number of fingers in fin field effect transistors employing a cluster of semiconductor fins which has a sublithographic pitch or otherwise includes a small dimension for a lateral spacing between adjacent semiconductor fins that is comparable with overlay tolerance of lithographic tools.

While the disclosure has been described in terms of specific embodiments, it is evident in view of the foregoing description that numerous alternatives, modifications and variations will be apparent to those skilled in the art. Each of the embodiments described herein can be implemented individually or in combination with any other embodiment unless expressly stated otherwise or clearly incompatible. Accordingly, the disclosure is intended to encompass all such alternatives, modifications and variations which fall within the scope and spirit of the disclosure and the following claims.

What is claimed is:

1. A semiconductor structure comprising a stack of a semiconductor fin and a dielectric fin located on an insulator layer, said stack extending along a lengthwise direction that is parallel to a topmost surface of said insulator layer, wherein a length of said dielectric fin is greater than a length of said semiconductor fin such that a first semiconductor end wall of said semiconductor fin and a first dielectric end wall of said dielectric fin are vertically coincident with each other, and a second dielectric end wall of said dielectric fin extends farther along said lengthwise direction than a second semiconductor end wall of said semiconductor fin, wherein said first and said second semiconductor end walls of said semiconductor fin and said first and said second dielectric end walls of said dielectric fin are perpendicular to said topmost surface of said insulator layer.

2. The semiconductor structure of claim 1, wherein a pair of semiconductor sidewalls of said semiconductor fin is vertically coincident with a pair of dielectric sidewalls of said dielectric fin.

3. The semiconductor structure of claim 1, further comprising a second stack of a second semiconductor fin and a second dielectric fin located on said insulator layer and laterally spaced from said stack by a uniform distance along a horizontal direction perpendicular to said lengthwise direction, wherein a third semiconductor end wall of said second semiconductor fin and a third dielectric end wall of said second dielectric fin are vertically coincident with each other, and a fourth semiconductor end wall of said second semiconductor fin and a fourth dielectric end wall of said second dielectric fin are vertically coincident with each other.

4. The semiconductor structure of claim 3, wherein said second dielectric end wall, said fourth semiconductor end wall, and said fourth dielectric end wall are located within a vertical plane.

5. The semiconductor structure of claim 4, wherein said first semiconductor end wall, said first dielectric end wall, said third semiconductor end wall, and said third dielectric end wall are located within another vertical plane.

6. The semiconductor structure of claim 1, further comprising another semiconductor fin located on said insulator layer and underlying said dielectric fin, wherein said semiconductor fin and said another semiconductor fin are laterally spaced from each other along said lengthwise direction.

7. The semiconductor structure of claim 6, wherein said another semiconductor fin comprises another semiconductor end wall that is vertically coincident with said second dielectric end wall of said dielectric fin.

8. The semiconductor structure of claim 1, further comprising at least another stack located on said insulator layer, wherein each of said at least another stack comprises another semiconductor fin and another dielectric fin, and a lateral extent of each of said at least another stack along said lengthwise direction is from a first vertical plane including said first semiconductor end wall and said first dielectric end wall to a second vertical plane including said second dielectric end wall.

9. The semiconductor structure of claim 8, wherein said at least another stack is a plurality of stacks that forms an array of periodic structures having a periodicity along a horizontal direction perpendicular to said lengthwise direction.

10. The semiconductor structure of claim 9, wherein a lateral spacing between said stack and a most proximate stack among said plurality of stacks is the same as a lateral spacing among said plurality of stacks.

11. The semiconductor structure of claim 8, further comprising a gate dielectric contacting a bottom surface of a portion of said dielectric fin that extends farther along said lengthwise direction than a second semiconductor end wall of said semiconductor fin.

12. The semiconductor structure of claim 11, further comprising a gate electrode overlying said portion of said dielectric fin that extends farther along said lengthwise direction than a second semiconductor end wall of said semiconductor fin.

13. The semiconductor structure of claim 1, wherein said insulator layer includes a topmost surface and a recessed region including a recessed horizontal surface and a curved surface that adjoins said recessed horizontal surface and adjoins said topmost surface at a recess edge, wherein said recess edge adjoins a bottom surface of said semiconductor fin.

14. The semiconductor structure of claim 13, wherein said recess edge is parallel to said lengthwise direction.

15. The semiconductor structure of claim 13, further comprising a second stack of a second semiconductor fin and a second dielectric fin located on said insulator layer and laterally spaced from said stack by a uniform distance along a horizontal direction perpendicular to said lengthwise direction, wherein a third semiconductor end wall of said second semiconductor fin and a third dielectric end wall of said second dielectric fin are vertically coincident with each other, and a fourth semiconductor end wall of said second semiconductor fin and a fourth dielectric end wall of said second dielectric fin are vertically coincident with each other, wherein an entirety of said second semiconductor fin contacts said topmost surface of said insulator layer.

16. A semiconductor structure comprising a semiconductor fin located on an insulator layer and extended along a lengthwise direction and another semiconductor fin is located on said insulator layer and extended along said lengthwise direction, said semiconductor fin spaced from said another semiconductor fin along said lengthwise direction such that a semiconductor end wall of said semiconductor fin faces a semiconductor end wall of said another semiconductor fin, wherein said insulator layer includes a topmost surface and a recessed region including a recessed horizontal surface and a curved surface that adjoins said recessed horizontal surface and adjoins said topmost surface at a recess edge, wherein said recess edge adjoins a bottom surface of each of said semiconductor fin and said another semiconductor fin, and wherein said lengthwise direction is parallel to said topmost surface of said insulator layer and said semiconductor end wall of said semiconductor fin and said semiconductor end wall of said another semiconductor fin are perpendicular to said topmost surface of said insulator layer.

17. The semiconductor structure of claim 16, wherein said recess edge is parallel to said lengthwise direction of said semiconductor fin.

18. The semiconductor structure of claim 17, further comprising a second semiconductor fin located on said insulator layer and laterally spaced from said semiconductor fin and said another semiconductor fin by a uniform distance along a horizontal direction perpendicular to said lengthwise direction.

19. The semiconductor structure of claim 18, wherein said semiconductor fin has a first semiconductor end wall and a second semiconductor end wall that are perpendicular to said lengthwise direction, said second semiconductor fin has a third semiconductor end wall and a fourth semiconductor end wall that are perpendicular to said lengthwise direction, said another semiconductor fin has a fifth semiconductor end wall and a sixth semiconductor end wall that are perpendicular to said lengthwise direction, and said first semiconductor end wall and said third semiconductor end wall are located within a same vertical plane, said fourth semiconductor end wall and said sixth semiconductor end wall are located within a same another vertical plane, said second semiconductor end wall and said fifth semiconductor end wall are facing each other along said lengthwise direction.

20. The semiconductor structure of claim 19, wherein said recess edge extends from a vertical plane including said second semiconductor end wall.

21. The semiconductor structure of claim 19, further comprising:
a first gate electrode that straddles a portion of said semiconductor fin and said second semiconductor fin between said same vertical plane and a vertical plane including said second semiconductor end wall;
a second gate electrode that straddles a portion of said another semiconductor fin and said second semiconductor fin between said same another vertical plane and a vertical plane including said fifth semiconductor end wall; and
a third gate electrode that straddles a portion of said second semiconductor fin between said vertical plane including said second semiconductor end wall and said vertical plane including said fifth semiconductor end wall.

22. The semiconductor structure of claim 19, further comprising a gate dielectric contacting said topmost surface, said recessed horizontal surface, and said curved surface.

23. The semiconductor structure of claim 17, further comprising a plurality of semiconductor fins that forms an array of periodic structures having a periodicity along a horizontal direction perpendicular to said lengthwise direction.

24. The semiconductor structure of claim 23, wherein a lateral spacing between said second semiconductor fin and a most proximate semiconductor fin among said plurality of semiconductor fins is the same as a lateral spacing among said plurality of semiconductor fins.

25. The semiconductor structure of claim 16, wherein said semiconductor fin comprises a single crystalline semiconductor material.

* * * * *